United States Patent
Bongiovi et al.

(10) Patent No.: US 10,313,791 B2
(45) Date of Patent: *Jun. 4, 2019

(54) SYSTEM AND METHOD FOR DIGITAL SIGNAL PROCESSING

(71) Applicant: Bongiovi Acoustics LLC, Port St. Lucie, FL (US)

(72) Inventors: Anthony Bongiovi, Port St. Lucie, FL (US); Philip Fuller, New York, NY (US); Glenn Zelniker, Gainesville, FL (US)

(73) Assignee: Bongiovi Acoustics LLC, Port St. Lucie, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/906,614

(22) Filed: Feb. 27, 2018

(65) Prior Publication Data
US 2018/0255396 A1    Sep. 6, 2018

Related U.S. Application Data

(63) Continuation of application No. 15/214,146, filed on Jul. 19, 2016, now Pat. No. 9,906,858, which is a
(Continued)

(51) Int. Cl.
*H03G 5/00* (2006.01)
*H04R 3/04* (2006.01)
(Continued)

(52) U.S. Cl.
CPC .............. *H04R 3/04* (2013.01); *G06F 3/165* (2013.01); *H03G 3/002* (2013.01); *H03G 5/165* (2013.01);
(Continued)

(58) Field of Classification Search
CPC ....... H04R 3/04; G06F 3/165; G06F 17/3074; G06F 16/60; H03G 3/002; H03G 5/165;
(Continued)

(56) References Cited

U.S. PATENT DOCUMENTS 2,643,729 A    6/1953    McCracken
2,755,336 A    7/1956    Zener et al.
(Continued)

FOREIGN PATENT DOCUMENTS

AU    2005274099    10/2010
AU    20070325096    4/2012
(Continued)

OTHER PUBLICATIONS

NovaSound Int., http://www.novasoundint.com/new_page_t.htm, 2004.
(Continued)

*Primary Examiner* — Andrew L Sniezek
(74) *Attorney, Agent, or Firm* — Malloy & Malloy, PL

(57) ABSTRACT

A system and method for digital processing including a gain element to process an input audio signal, a high pass filter to then filter the signal and create a high pass signal, a first filter module to filter the high pass signal and create a first filtered signal and a splitter to split the high pass signal into two high pass signals. The first filter module filters one high pass signals before a first compressor modulates the signal or a high pass signal to create a modulated signal. A second filter module filters the modulated signal to create a second filtered signal that is processed by a first processing module including a band splitter that splits the signal into low and high band signals that are then modulated by compressors. A second processing module processes the modulated low and high band signals to create an output signal.

9 Claims, 14 Drawing Sheets

Related U.S. Application Data continuation-in-part of application No. 14/059,669, filed on Oct. 22, 2013, now Pat. No. 9,397,629.

(51) Int. Cl.

| | | |
|---|---|---|
| *H03G 3/00* | (2006.01) | |
| *G06F 3/16* | (2006.01) | |
| *H03G 5/16* | (2006.01) | |
| *H03G 7/00* | (2006.01) | |
| *H03G 9/00* | (2006.01) | |
| *H03G 9/02* | (2006.01) | |
| *H04S 7/00* | (2006.01) | |
| *G10L 21/034* | (2013.01) | |
| *H03G 9/14* | (2006.01) | |
| *G06F 16/60* | (2019.01) | |
| *H03G 5/02* | (2006.01) | |

(52) U.S. Cl.
CPC ............ *H03G 7/002* (2013.01); *H03G 7/007* (2013.01); *H03G 9/005* (2013.01); *H03G 9/025* (2013.01); *H04S 7/307* (2013.01); *G06F 16/60* (2019.01); *G10L 21/034* (2013.01); *H03G 3/005* (2013.01); *H03G 5/025* (2013.01); *H03G 9/14* (2013.01)

(58) Field of Classification Search
CPC ........ H03G 9/005; H03G 9/025; H03G 3/005; H03G 5/025; H03G 7/007; H03G 9/14; H03G 7/002; G10L 21/034; H04S 7/307
See application file for complete search history.

(56) References Cited

U.S. PATENT DOCUMENTS

| | | |
|---|---|---|
| 3,396,241 A | 8/1968 | Anderson |
| 3,430,007 A | 2/1969 | Thielen |
| 3,662,076 A | 5/1972 | Gordon et al. |
| 3,795,876 A | 3/1974 | Takashi et al. |
| 3,813,687 A | 5/1974 | Geil |
| 4,162,462 A | 7/1979 | Endoh et al. |
| 4,184,047 A | 1/1980 | Langford |
| 4,215,583 A | 8/1980 | Botsco et al. |
| 4,218,950 A | 8/1980 | Uetrecht |
| 4,226,533 A | 10/1980 | Snowman |
| 4,257,325 A | 3/1981 | Bertagni |
| 4,277,367 A | 7/1981 | Madsen et al. |
| 4,286,455 A | 9/1981 | Ophir et al. |
| 4,331,021 A | 5/1982 | Lopez et al. |
| 4,353,035 A | 10/1982 | Schröder |
| 4,356,558 A | 10/1982 | Owen et al. |
| 4,363,007 A | 12/1982 | Haramoto et al. |
| 4,392,027 A | 7/1983 | Bock |
| 4,399,474 A | 8/1983 | Coleman, Jr. |
| 4,412,100 A | 10/1983 | Orban |
| 4,458,362 A | 7/1984 | Berkovitz et al. |
| 4,489,280 A | 12/1984 | Bennett, Jr. et al. |
| 4,517,415 A | 5/1985 | Laurence |
| 4,538,297 A | 8/1985 | Waller |
| 4,549,289 A | 10/1985 | Schwartz et al. |
| 4,584,700 A | 4/1986 | Scholz |
| 4,602,381 A | 7/1986 | Cugnini et al. |
| 4,612,665 A | 9/1986 | Inami et al. |
| 4,641,361 A | 2/1987 | Rosback |
| 4,677,645 A | 6/1987 | Kaniwa et al. |
| 4,696,044 A | 9/1987 | Waller, Jr. |
| 4,701,953 A | 10/1987 | White |
| 4,704,726 A | 11/1987 | Gibson |
| 4,715,559 A | 12/1987 | Fuller |
| 4,739,514 A | 4/1988 | Short et al. |
| 4,815,142 A | 3/1989 | Imreh |
| 4,856,068 A | 8/1989 | Quatieri, Jr. et al. |
| 4,887,299 A | 12/1989 | Cummins et al. |
| 4,997,058 A | 3/1991 | Bertagni |
| 5,007,707 A | 4/1991 | Bertagni |
| 5,073,936 A | 12/1991 | Gurike et al. |
| 5,133,015 A | 7/1992 | Scholz |
| 5,195,141 A | 3/1993 | Jang |
| 5,210,806 A | 5/1993 | Kihara et al. |
| 5,239,997 A | 8/1993 | Guarino et al. |
| 5,355,417 A | 10/1994 | Burdisso et al. |
| 5,361,381 A | 11/1994 | Short |
| 5,384,856 A | 1/1995 | Kyouno et al. |
| 5,420,929 A | 5/1995 | Geddes et al. |
| 5,425,107 A | 6/1995 | Bertagni et al. |
| 5,463,695 A | 10/1995 | Werrbach |
| 5,465,421 A | 11/1995 | McCormick et al. |
| 5,467,775 A | 11/1995 | Callahan et al. |
| 5,473,214 A | 12/1995 | Hildebrand |
| 5,515,444 A | 5/1996 | Burdisso et al. |
| 5,539,835 A | 7/1996 | Bertagni et al. |
| 5,541,866 A | 7/1996 | Sato et al. |
| 5,572,443 A | 11/1996 | Emoto et al. |
| 5,615,275 A | 3/1997 | Bertagni |
| 5,617,480 A | 4/1997 | Ballard et al. |
| 5,638,456 A | 6/1997 | Conley et al. |
| 5,640,685 A | 6/1997 | Komoda |
| 5,671,287 A | 9/1997 | Gerzon |
| 5,693,917 A | 12/1997 | Bertagni et al. |
| 5,699,438 A | 12/1997 | Smith et al. |
| 5,727,074 A | 3/1998 | Hildebrand |
| 5,737,432 A | 4/1998 | Werrbach |
| 5,812,684 A | 9/1998 | Mark |
| 5,828,768 A | 10/1998 | Eatwell et al. |
| 5,832,097 A | 11/1998 | Armstrong et al. |
| 5,838,805 A | 11/1998 | Warnaka et al. |
| 5,848,164 A | 12/1998 | Levine |
| 5,861,686 A | 1/1999 | Lee |
| 5,862,461 A | 1/1999 | Yoshizawa et al. |
| 5,872,852 A | 2/1999 | Dougherty |
| 5,883,339 A | 3/1999 | Greenberger |
| 5,901,231 A | 5/1999 | Parrella et al. |
| 5,990,955 A | 11/1999 | Koz |
| 6,002,777 A | 12/1999 | Grasfield et al. |
| 6,058,196 A | 5/2000 | Heron |
| 6,078,670 A | 6/2000 | Beyer |
| 6,093,144 A | 7/2000 | Jaeger et al. |
| 6,108,431 A | 8/2000 | Bachler |
| 6,195,438 B1 | 2/2001 | Yumoto et al. |
| 6,201,873 B1 | 3/2001 | Dal Farra |
| 6,202,601 B1 | 3/2001 | Ouellette et al. |
| 6,208,237 B1 | 3/2001 | Saiki et al. |
| 6,220,866 B1 | 4/2001 | Amend et al. |
| 6,263,354 B1 | 7/2001 | Gandhi |
| 6,285,767 B1 | 9/2001 | Klayman |
| 6,292,511 B1 | 9/2001 | Goldston et al. |
| 6,317,117 B1 | 11/2001 | Goff |
| 6,318,797 B1 | 11/2001 | Böhm et al. |
| 6,332,029 B1 | 12/2001 | Azima et al. |
| 6,343,127 B1 | 1/2002 | Billoud |
| 6,518,852 B1 | 2/2003 | Derrick |
| 6,529,611 B2 | 3/2003 | Kobayashi et al. |
| 6,535,846 B1 | 3/2003 | Shashoua |
| 6,570,993 B1 | 5/2003 | Fukuyama |
| 6,587,564 B1 | 7/2003 | Cusson |
| 6,618,487 B1 | 9/2003 | Azima et al. |
| 6,661,897 B2 | 12/2003 | Smith |
| 6,661,900 B1 | 12/2003 | Allred et al. |
| 6,772,114 B1 | 8/2004 | Sluijter et al. |
| 6,847,258 B2 | 1/2005 | Ishida et al. |
| 6,871,525 B2 | 3/2005 | Withnall et al. |
| 6,907,391 B2 | 6/2005 | Bellora et al. |
| 6,999,826 B1 | 2/2006 | Zhou et al. |
| 7,006,653 B2 | 2/2006 | Guenther |
| 7,016,746 B2 | 3/2006 | Wiser et al. |
| 7,024,001 B1 | 4/2006 | Nakada |
| 7,058,463 B1 | 6/2006 | Ruha et al. |
| 7,123,728 B2 | 10/2006 | King et al. |
| 7,236,602 B2 | 6/2007 | Gustavsson |
| 7,254,243 B2 | 8/2007 | Bongiovi |
| 7,266,205 B2 | 9/2007 | Miller |
| 7,269,234 B2 | 9/2007 | Klingenbrunn et al. |
| 7,274,795 B2 | 9/2007 | Bongiovi |

(56) References Cited

U.S. PATENT DOCUMENTS

| | | |
|---|---|---|
| 7,519,189 B2 | 4/2009 | Bongiovi |
| 7,577,263 B2 | 8/2009 | Tourwe |
| 7,613,314 B2 | 11/2009 | Camp, Jr. |
| 7,676,048 B2 | 3/2010 | Tsutsui |
| 7,711,129 B2 | 5/2010 | Lindahl |
| 7,711,442 B2 | 5/2010 | Ryle et al. |
| 7,747,447 B2 | 6/2010 | Christensen et al. |
| 7,764,802 B2 | 7/2010 | Oliver |
| 7,778,718 B2 | 8/2010 | Janke et al. |
| 7,916,876 B1 | 3/2011 | Helsloot |
| 8,068,621 B2 | 11/2011 | Okabayashi et al. |
| 8,144,902 B2 | 3/2012 | Johnston |
| 8,160,274 B2 | 4/2012 | Bongiovi |
| 8,175,287 B2 | 5/2012 | Ueno et al. |
| 8,218,789 B2 | 7/2012 | Bharitkar et al. |
| 8,229,136 B2 | 7/2012 | Bongiovi |
| 8,284,955 B2 | 10/2012 | Bongiovi et al. |
| 8,385,864 B2 | 2/2013 | Dickson et al. |
| 8,462,963 B2 | 6/2013 | Bongiovi |
| 8,472,642 B2 | 6/2013 | Bongiovi |
| 8,503,701 B2 | 8/2013 | Miles et al. |
| 8,565,449 B2 | 10/2013 | Bongiovi |
| 8,577,676 B2 | 11/2013 | Muesch |
| 8,619,998 B2 | 12/2013 | Walsh et al. |
| 8,705,765 B2 | 4/2014 | Bongiovi |
| 8,750,538 B2 | 6/2014 | Avendano et al. |
| 8,811,630 B2 | 8/2014 | Burlingame |
| 8,879,743 B1 | 11/2014 | Mitra |
| 9,195,433 B2 | 11/2015 | Bongiovi et al. |
| 9,264,004 B2 | 2/2016 | Bongiovi et al. |
| 9,275,556 B1 | 3/2016 | East et al. |
| 9,276,542 B2 | 3/2016 | Bongiovi et al. |
| 9,281,794 B1 | 3/2016 | Bongiovi et al. |
| 9,344,828 B2 | 5/2016 | Bongiovi et al. |
| 9,348,904 B2 * | 5/2016 | Bongiovi ............... G10L 21/02 |
| 9,350,309 B2 | 5/2016 | Bongiovi et al. |
| 9,397,629 B2 * | 7/2016 | Bongiovi ............... H03G 5/165 |
| 9,398,394 B2 | 7/2016 | Bongiovi et al. |
| 9,413,321 B2 | 8/2016 | Bongiovi et al. |
| 9,564,146 B2 | 2/2017 | Bongiovi et al. |
| 9,615,189 B2 | 4/2017 | Copt et al. |
| 9,615,813 B2 | 4/2017 | Copt et al. |
| 9,621,994 B1 | 4/2017 | Bongiovi et al. |
| 9,638,672 B2 | 5/2017 | Butera, III et al. |
| 9,741,355 B2 | 8/2017 | Bongiovi et al. |
| 9,793,872 B2 | 10/2017 | Bongiovi et al. |
| 9,883,318 B2 | 1/2018 | Bongiovi et al. |
| 9,906,858 B2 * | 2/2018 | Bongiovi ............... H04R 3/04 |
| 9,906,867 B2 | 2/2018 | Bongiovi et al. |
| 9,998,832 B2 | 6/2018 | Bongiovi et al. |
| 2001/0008535 A1 | 7/2001 | Lanigan |
| 2001/0043704 A1 | 11/2001 | Schwartz |
| 2002/0057808 A1 | 5/2002 | Goldstein |
| 2002/0071481 A1 | 6/2002 | Goodings |
| 2002/0094096 A1 | 7/2002 | Paritsky et al. |
| 2002/0170339 A1 | 11/2002 | Passi et al. |
| 2003/0016838 A1 | 1/2003 | Paritsky et al. |
| 2003/0023429 A1 | 1/2003 | Claesson et al. |
| 2003/0035555 A1 | 2/2003 | King et al. |
| 2003/0043940 A1 | 3/2003 | Janky et al. |
| 2003/0112088 A1 | 6/2003 | Bizjak |
| 2003/0138117 A1 | 7/2003 | Goff |
| 2003/0142841 A1 | 7/2003 | Wiegand |
| 2003/0164546 A1 | 9/2003 | Giger |
| 2003/0179891 A1 | 9/2003 | Rabinowitz et al. |
| 2003/0216907 A1 | 11/2003 | Thomas |
| 2004/0003805 A1 | 1/2004 | Ono et al. |
| 2004/0005063 A1 | 1/2004 | Klayman |
| 2004/0022400 A1 | 2/2004 | Magrath |
| 2004/0044804 A1 | 3/2004 | MacFarlane |
| 2004/0086144 A1 | 5/2004 | Kallen |
| 2004/0103588 A1 | 6/2004 | Allaei |
| 2004/0105556 A1 | 6/2004 | Grove |
| 2004/0138769 A1 | 7/2004 | Akiho |
| 2004/0146170 A1 | 7/2004 | Zint |
| 2004/0189264 A1 | 9/2004 | Matsuura et al. |
| 2004/0208646 A1 | 10/2004 | Choudhary et al. |
| 2005/0013453 A1 | 1/2005 | Cheung |
| 2005/0090295 A1 | 4/2005 | Ali et al. |
| 2005/0117771 A1 | 6/2005 | Vosburgh et al. |
| 2005/0129248 A1 | 6/2005 | Kraemer et al. |
| 2005/0175185 A1 | 8/2005 | Korner |
| 2005/0201572 A1 | 9/2005 | Lindahl et al. |
| 2005/0249272 A1 | 11/2005 | Kirkeby et al. |
| 2005/0254564 A1 | 11/2005 | Tsutsui |
| 2006/0034467 A1 | 2/2006 | Sleboda et al. |
| 2006/0064301 A1 | 3/2006 | Aguilar et al. |
| 2006/0098827 A1 | 5/2006 | Paddock et al. |
| 2006/0115107 A1 | 6/2006 | Vincent et al. |
| 2006/0126851 A1 | 6/2006 | Yuen et al. |
| 2006/0126865 A1 | 6/2006 | Blamey et al. |
| 2006/0138285 A1 | 6/2006 | Oleski et al. |
| 2006/0140319 A1 | 6/2006 | Eldredge et al. |
| 2006/0153281 A1 | 7/2006 | Karlsson |
| 2006/0189841 A1 | 8/2006 | Pluvinage |
| 2006/0285696 A1 | 12/2006 | Houtsma |
| 2006/0291670 A1 | 12/2006 | King et al. |
| 2007/0010132 A1 | 1/2007 | Nelson |
| 2007/0030994 A1 | 2/2007 | Ando et al. |
| 2007/0119421 A1 | 5/2007 | Lewis et al. |
| 2007/0150267 A1 | 6/2007 | Honma et al. |
| 2007/0165872 A1 | 7/2007 | Bridger et al. |
| 2007/0173990 A1 | 7/2007 | Smith et al. |
| 2007/0177459 A1 | 8/2007 | Behn |
| 2007/0206643 A1 | 9/2007 | Egan |
| 2007/0223713 A1 | 9/2007 | Gunness |
| 2007/0223717 A1 | 9/2007 | Boersma |
| 2007/0253577 A1 | 11/2007 | Yen et al. |
| 2008/0031462 A1 | 2/2008 | Walsh et al. |
| 2008/0040116 A1 | 2/2008 | Cronin |
| 2008/0069385 A1 | 3/2008 | Revit |
| 2008/0093157 A1 | 4/2008 | Drummond et al. |
| 2008/0112576 A1 | 5/2008 | Bongiovi |
| 2008/0123870 A1 | 5/2008 | Stark |
| 2008/0123873 A1 | 5/2008 | Bjorn-Josefsen et al. |
| 2008/0137876 A1 | 6/2008 | Kassan et al. |
| 2008/0137881 A1 | 6/2008 | Bongiovi |
| 2008/0165989 A1 | 7/2008 | Seil et al. |
| 2008/0181424 A1 | 7/2008 | Schulein et al. |
| 2008/0212798 A1 | 9/2008 | Zartarian |
| 2008/0219459 A1 | 9/2008 | Bongiovi et al. |
| 2008/0255855 A1 | 10/2008 | Lee et al. |
| 2009/0022328 A1 | 1/2009 | Neugebauer et al. |
| 2009/0054109 A1 | 2/2009 | Hunt |
| 2009/0062946 A1 | 3/2009 | Bongiovi et al. |
| 2009/0080675 A1 | 3/2009 | Smirnov et al. |
| 2009/0086996 A1 | 4/2009 | Bongiovi et al. |
| 2009/0211838 A1 | 8/2009 | Bilan |
| 2009/0282810 A1 | 11/2009 | Leone et al. |
| 2009/0290725 A1 | 11/2009 | Huang |
| 2009/0296959 A1 | 12/2009 | Bongiovi |
| 2010/0045374 A1 | 2/2010 | Wu et al. |
| 2010/0166222 A1 | 7/2010 | Bongiovi |
| 2010/0256843 A1 | 10/2010 | Bergstein et al. |
| 2010/0278364 A1 | 11/2010 | Berg |
| 2010/0303278 A1 | 12/2010 | Sahyoun |
| 2011/0002467 A1 | 1/2011 | Nielsen |
| 2011/0013736 A1 | 1/2011 | Tsukamoto et al. |
| 2011/0065408 A1 | 3/2011 | Kenington et al. |
| 2011/0087346 A1 | 4/2011 | Larsen et al. |
| 2011/0096936 A1 | 4/2011 | Gass |
| 2011/0194712 A1 | 8/2011 | Potard |
| 2011/0230137 A1 | 9/2011 | Hicks et al. |
| 2011/0257833 A1 | 10/2011 | Trush et al. |
| 2012/0008798 A1 | 1/2012 | Ong |
| 2012/0014553 A1 | 1/2012 | Bonanno |
| 2012/0099741 A1 | 4/2012 | Gotoh et al. |
| 2012/0170759 A1 | 7/2012 | Yuen et al. |
| 2012/0189131 A1 | 7/2012 | Ueno et al. |
| 2012/0213034 A1 | 8/2012 | Imran |
| 2012/0213375 A1 | 8/2012 | Mahabub et al. |
| 2012/0300949 A1 | 11/2012 | Rauhala |
| 2012/0302920 A1 | 11/2012 | Bridger et al. |
| 2012/0329904 A1 | 12/2012 | Suita et al. |

(56) References Cited

U.S. PATENT DOCUMENTS

| | | |
|---|---|---|
| 2013/0083958 A1 | 4/2013 | Katz et al. |
| 2013/0121507 A1 | 5/2013 | Bongiovi et al. |
| 2013/0162908 A1 | 6/2013 | Son et al. |
| 2013/0163783 A1 | 6/2013 | Burlingame |
| 2013/0169779 A1 | 7/2013 | Pedersen |
| 2013/0220274 A1 | 8/2013 | Deshpande et al. |
| 2013/0227631 A1 | 8/2013 | Sharma et al. |
| 2013/0242191 A1 | 9/2013 | Leyendecker |
| 2013/0288596 A1 | 10/2013 | Suzuki et al. |
| 2013/0338504 A1 | 12/2013 | Demos et al. |
| 2014/0067236 A1 | 3/2014 | Henry et al. |
| 2014/0100682 A1 | 4/2014 | Bongiovi |
| 2014/0112497 A1 | 4/2014 | Bongiovi |
| 2014/0119583 A1 | 5/2014 | Valentine et al. |
| 2014/0153730 A1 | 6/2014 | Habboushe et al. |
| 2014/0153765 A1 | 6/2014 | Gan et al. |
| 2014/0185829 A1 | 7/2014 | Bongiovi |
| 2014/0261301 A1 | 9/2014 | Leone |
| 2014/0369504 A1 | 12/2014 | Bongiovi |
| 2014/0369521 A1 | 12/2014 | Bongiovi et al. |
| 2014/0379355 A1 | 12/2014 | Hosokawsa |
| 2015/0201272 A1 | 7/2015 | Wong |
| 2015/0215720 A1 | 7/2015 | Carroll |
| 2015/0297169 A1 | 10/2015 | Copt et al. |
| 2015/0297170 A1 | 10/2015 | Copt et al. |
| 2015/0339954 A1 | 11/2015 | East et al. |
| 2016/0036402 A1 | 2/2016 | Bongiovi et al. |
| 2016/0044436 A1 | 2/2016 | Copt et al. |
| 2016/0225288 A1 | 8/2016 | East et al. |
| 2016/0240208 A1 | 8/2016 | Bongiovi et al. |
| 2016/0258907 A1 | 9/2016 | Butera, III et al. |
| 2016/0344361 A1 | 11/2016 | Bongiovi et al. |
| 2016/0370285 A1 | 12/2016 | Jang et al. |
| 2017/0020491 A1 | 1/2017 | Ogawa |
| 2017/0033755 A1 | 2/2017 | Bongiovi et al. |
| 2017/0041732 A1 | 2/2017 | Bongiovi et al. |
| 2017/0122915 A1 | 5/2017 | Vogt et al. |
| 2017/0188989 A1 | 7/2017 | Copt et al. |
| 2017/0193980 A1 | 7/2017 | Bongiovi et al. |
| 2017/0263158 A1 | 9/2017 | East et al. |
| 2017/0272887 A1 | 9/2017 | Copt et al. |
| 2017/0289695 A1 | 10/2017 | Bongiovi et al. |
| 2018/0091109 A1 | 3/2018 | Bongiovi et al. |
| 2018/0102133 A1 | 4/2018 | Bongiovi et al. |
| 2019/0020950 A1 | 1/2019 | Bongiovi et al. |

FOREIGN PATENT DOCUMENTS

| | | |
|---|---|---|
| AU | 2012202127 | 7/2014 |
| BR | 96114177 | 2/1999 |
| BR | 96113723 | 7/1999 |
| CA | 2533221 | 6/1995 |
| CA | 2161412 | 4/2000 |
| CA | 2576829 | 7/2014 |
| CN | 1139842 | 1/1997 |
| CN | 1173268 A | 2/1998 |
| CN | 1221528 A | 6/1999 |
| CN | 1357136 A | 7/2002 |
| CN | 1391780 | 1/2003 |
| CN | 1879449 | 12/2006 |
| CN | 1910816 A | 2/2007 |
| CN | 101277331 | 10/2008 |
| CN | 101518083 | 8/2009 |
| CN | 101536541 A | 9/2009 |
| CN | 101720557 | 6/2010 |
| CN | 101946526 A | 1/2011 |
| CN | 101964189 | 2/2011 |
| CN | 102265641 | 11/2011 |
| CN | 102652337 | 8/2012 |
| CN | 102772222 A | 11/2012 |
| CN | 102822891 | 12/2012 |
| CN | 103004237 A | 3/2013 |
| CN | 0780050323X | 5/2013 |
| CN | 203057339 | 7/2013 |
| CN | 103250209 | 8/2013 |
| CN | 103262577 | 8/2013 |
| CN | 103348697 | 10/2013 |
| CN | 103455824 | 12/2013 |
| EP | 0206746 B1 | 8/1992 |
| EP | 0541646 | 1/1995 |
| EP | 0580579 | 6/1998 |
| EP | 0698298 | 2/2000 |
| EP | 0932523 | 6/2000 |
| EP | 0666012 | 11/2002 |
| EP | 2814267 B1 | 10/2016 |
| ES | 2218599 | 10/1998 |
| ES | 2249788 | 10/1998 |
| ES | 2219949 | 8/1999 |
| GB | 2003707 A | 3/1979 |
| GB | 2320393 | 12/1996 |
| ID | P0031074 | 6/2012 |
| IN | 260362 | 4/2014 |
| IS | 198914 | 7/2014 |
| JP | 3150910 | 6/1991 |
| JP | 7106876 | 4/1995 |
| JP | 2005500768 | 1/2005 |
| JP | 2011059714 | 3/2011 |
| JP | 4787255 | 7/2011 |
| JP | 5048782 | 7/2012 |
| JP | 201543561 | 3/2015 |
| KR | 1020040022442 | 3/2004 |
| KR | 1020090101209 | 9/2009 |
| KR | 101503541 | 3/2015 |
| MO | J001182 | 10/2013 |
| MX | 274143 | 8/2005 |
| MX | 301172 | 11/2006 |
| MX | 315197 | 11/2013 |
| NZ | 553744 | 1/2009 |
| NZ | 574141 | 4/2010 |
| NZ | 557201 | 5/2012 |
| PH | 12009501073 | 11/2014 |
| RU | 2407142 | 12/2010 |
| RU | 2483363 | 5/2013 |
| SG | 152762 | 12/2011 |
| SG | 155213 | 2/2013 |
| SU | 1319288 | 6/1987 |
| TW | 401713 | 8/2000 |
| WO | WO 9219080 | 10/1992 |
| WO | WO 1993011637 | 6/1993 |
| WO | WO 9321743 | 10/1993 |
| WO | WO 9427331 | 11/1994 |
| WO | WO 9514296 | 5/1995 |
| WO | WO 9551805 | 11/1995 |
| WO | WO 9535628 | 12/1995 |
| WO | WO 9601547 | 1/1996 |
| WO | WO 9611465 | 4/1996 |
| WO | WO 9708847 | 3/1997 |
| WO | WO 9709698 | 3/1997 |
| WO | WO 9709840 | 3/1997 |
| WO | WO 9709841 | 3/1997 |
| WO | WO 9709842 | 3/1997 |
| WO | WO 9709843 | 3/1997 |
| WO | WO 9709844 | 3/1997 |
| WO | WO 9709845 | 3/1997 |
| WO | WO 9709846 | 3/1997 |
| WO | WO 9709848 | 3/1997 |
| WO | WO 9709849 | 3/1997 |
| WO | WO 9709852 | 3/1997 |
| WO | WO 9709853 | 3/1997 |
| WO | WO 9709854 | 3/1997 |
| WO | WO 9709855 | 3/1997 |
| WO | WO 9709856 | 3/1997 |
| WO | WO 9709857 | 3/1997 |
| WO | WO 9709858 | 3/1997 |
| WO | WO 9709859 | 3/1997 |
| WO | WO 9709861 | 3/1997 |
| WO | WO 9709862 | 3/1997 |
| WO | WO 9717818 | 5/1997 |
| WO | WO 9717820 | 5/1997 |
| WO | WO 9813942 | 4/1998 |
| WO | WO 9816409 | 4/1998 |
| WO | WO 9828942 | 7/1998 |
| WO | WO 9831188 | 7/1998 |
| WO | WO 9834320 | 8/1998 |

(56) References Cited

FOREIGN PATENT DOCUMENTS

| | | |
|---|---|---|
| WO | WO 9839947 | 9/1998 |
| WO | WO 9842536 | 10/1998 |
| WO | WO 9843464 | 10/1998 |
| WO | WO 9852381 | 11/1998 |
| WO | WO 9852383 | 11/1998 |
| WO | WO 9853638 | 11/1998 |
| WO | WO 9902012 | 1/1999 |
| WO | WO 9908479 | 2/1999 |
| WO | WO 9911490 | 3/1999 |
| WO | WO 9912387 | 3/1999 |
| WO | WO 9913684 | 3/1999 |
| WO | WO 9921397 | 4/1999 |
| WO | WO 9935636 | 7/1999 |
| WO | WO 9935883 | 7/1999 |
| WO | WO 9937121 | 7/1999 |
| WO | WO 9938155 | 7/1999 |
| WO | WO 9941939 | 8/1999 |
| WO | WO 9952322 | 10/1999 |
| WO | WO 9952324 | 10/1999 |
| WO | WO 9956497 | 11/1999 |
| WO | WO 9962294 | 12/1999 |
| WO | WO 9965274 | 12/1999 |
| WO | WO 0001264 | 1/2000 |
| WO | WO 0002417 | 1/2000 |
| WO | WO 0007408 | 2/2000 |
| WO | WO 0007409 | 2/2000 |
| WO | WO 0013464 | 3/2000 |
| WO | WO 0015003 | 3/2000 |
| WO | WO 0033612 | 6/2000 |
| WO | WO 0033613 | 6/2000 |
| WO | WO 03104924 | 12/2003 |
| WO | WO 2006020427 | 2/2006 |
| WO | WO 2007092420 | 8/2007 |
| WO | WO 2008067454 | 6/2008 |
| WO | WO 2009070797 | 6/2009 |
| WO | WO 2009102750 | 8/2009 |
| WO | WO 2009114746 | 9/2009 |
| WO | WO 2009155057 | 12/2009 |
| WO | WO 2010027705 | 3/2010 |
| WO | WO 2010051354 | 5/2010 |
| WO | WO 2011081965 | 7/2011 |
| WO | WO 2012134399 | 10/2012 |
| WO | WO 2013055394 | 4/2013 |
| WO | WO 2013076223 | 5/2013 |
| WO | WO 2014201103 | 12/2014 |
| WO | WO 2015061393 | 4/2015 |
| WO | WO 2015077681 | 5/2015 |
| WO | WO 2015161034 | 10/2015 |
| WO | WO 2016019263 | 2/2016 |
| WO | WO 2016022422 | 2/2016 |
| WO | WO 2016144861 A1 | 9/2016 |

OTHER PUBLICATIONS

Sepe, Michael. "Density & Molecular Weight in Polyethylene." Plastic Technology. Gardner Business Media, Inc., May 29, 2012. Web. http://ptonline.com/columns/density-rnolecular-weight-in-polyethylene.

Stephan Peus et al. "Natürliche Hören mite künstlichem Kopf", Funkschau—Zeitschrift für elektronische Kommunikation, Dec. 31, 1983, pp. 1-4, XP055451269. Web: https://www.neumann.com/?lang-en&id=hist_microphones&cid=ku80_publications.

\* cited by examiner

SYSTEM AND METHOD FOR DIGITAL SIGNAL PROCESSING

CLAIM OF PRIORITY

The present application is a continuation application of previously filed Ser. No. 15/214,146, filed on Jul. 19, 2016, which matured into U.S. Pat. No. 9,906,858 on Feb. 27, 2018, which is a continuation-in-part application of previously filed Ser. No. 14/059,669, filed on Oct. 22, 2013, which matured into U.S. Pat. No. 9,397,629 on Jul. 19, 2016, which are incorporated herein by reference.

BACKGROUND OF THE INVENTION

Field of the Invention

The present invention provides for methods and systems for digitally processing an audio signal. Specifically, some embodiments relate to digitally processing an audio signal in order to deliver studio-quality sound in a variety of consumer electronic devices.

Description of the Related Art

Historically, studio-quality sound, which can best be described as the full reproduction of the complete range of audio frequencies that are utilized during the studio recording process, has only been able to be achieved, appropriately, in audio recording studios. Studio-quality sound is characterized by the level of clarity and brightness which is attained only when the upper-mid frequency ranges are effectively manipulated and reproduced. While the technical underpinnings of studio-quality sound can be fully appreciated only by experienced record producers, the average listener can easily hear the difference that studio-quality sound makes.

While various attempts have been made to reproduce studio-quality sound outside of the recording studio, those attempts have come at tremendous expense (usually resulting from advanced speaker design, costly hardware, and increased power amplification) and have achieved only mixed results. Thus, there exists a need for a process whereby studio-quality sound can be reproduced outside of the studio with consistent, high quality results at a low cost. There exists a further need for audio devices embodying such a process in the form of computer chips embedded within audio devices, or within processing devices separate and standalone from the audio devices. There also exists a need for the ability to produce studio-quality sound through inexpensive speakers, as well as through a variety of readily available consumer devices capable of reproducing sound, in both hardware-based and software-based embodiments.

SUMMARY OF THE INVENTION

The present invention meets the existing needs described above by providing for a system and method of digitally processing an audio signal in a manner such that studio-quality sound can be reproduced across the entire spectrum of audio devices. The present invention also provides for the ability to enhance audio in real-time and tailors the enhancement to the audio signal of a given audio device or delivery system and playback environment.

The present invention may provide for a computer chip that can digitally process an audio signal in such a manner, as well as provide for audio devices that comprise such a chip or equivalent circuit combination. The present invention may also provide for computer software readable and executable by a computer to digitally process an audio signal. In the software embodiments, the present invention may utilize existing hardware and software components on computers such as PCs, Mac, and mobile devices, comprising various operating systems such as Android, iOS, and Windows.

Accordingly, in initially broad terms, an audio input signal is first filtered with a high pass filter. In at least one embodiment, the input audio signal is processed with a first gain element. In at least one embodiment the first gain signal is then filtered with the high pass filter. The high pass filter, in at least one embodiment, is configured to remove ultra-low frequency content from the input audio signal resulting in the generation of a high pass signal.

In at least one embodiment, the high pass signal from the high pass filter is then filtered through a first filter module to create a first filtered signal. The first filter module is configured to selectively boost and/or attenuate the gain of select frequency ranges in an audio signal, such as the high pass signal.

In at least one embodiment, the first filter module boosts frequencies above a first frequency, and attenuates frequencies below a first frequency. In at least one embodiment, the high pass signal from the high pass filter is then split into a first high pass signal and a second high pass signal.

In at least one embodiment, the first filtered signal from the first filter module is then modulated with a first compressor to create a modulated signal. In at least one embodiment, the second high pass signal is then filtered through a first filter module to create a first filtered signal. In at least one embodiment, the first high pass signal is then modulated with a first compressor to create a modulated signal. The first compressor is configured for the dynamic range compression of a signal, such as the first filtered signal. Because the first filtered signal boosted higher frequencies and attenuated lower frequencies, the first compressor may, in at least one embodiment, be configured to trigger and adjust the higher frequency material, while remaining relatively insensitive to lower frequency material.

In at least one embodiment, the modulated signal from the first compressor is then filtered through a second filter module to create a second filtered signal. The second filter module is configured to selectively boost and/or attenuate the gain of select frequency ranges in an audio signal, such as the modulated signal. In at least one embodiment, the second filter module is configured to be in an at least partially inverse relation to the first filter module. For example, if the first filter module boosted content above a first frequency by +X dB and attenuated content below a first frequency by −Y dB, the second filter module may then attenuate the content above the first frequency by −X dB, and boost the content below the first frequency by +Y dB. In other words, the purpose of the second filter module in one embodiment may be to "undo" the gain adjustment that was applied by the first filter module.

In at least one embodiment, the second filtered signal from the second filter module is then processed with a first processing module to create a processed signal. In at least one embodiment, the modulated signal from the first compressor is then processed with a first processing module to create a processed signal. In at least one embodiment, the first processing module may comprise a peak/dip module. In other embodiments, the first processing module may comprise both a peak/dip module and a first gain element. The first gain element may be configured to adjust the gain of the signal, such as the second filtered signal. The peak/dip module may be configured to shape the signal, such as to increase or decrease overshoots or undershoots in the signal.

The processed signal from the first processing module is then split with a band splitter into at least low band signal and a high band signal. In at least one embodiment, each band may comprise the output of a fourth order section, which may be realized as the cascade of second order biquad filters.

The low band signal is modulated with a low band compressor to create a modulated low band signal, and the high band signal is modulated with a high band compressor to create a modulated high band signal. The low band compressor and high band compressor are each configured to dynamically adjust the gain of a signal. Each of the low band compressor and high band compressor may be computationally and/or configured identically as the first compressor.

At least the modulated low band signal and the modulated high band signal are then processed with a second processing module. The second processing module may comprise a summing module configured to combine the signals. The summing module in at least one embodiment may individually alter the gain of at least each of the modulated low band, and modulated high band signals. The second processing module may further comprise a second gain element. The second gain element may adjust the gain of the combined signal in order to create an output signal.

These and other objects, features and advantages of the present invention will become clearer when the drawings as well as the detailed description are taken into consideration.

BRIEF DESCRIPTION OF THE DRAWINGS

For a fuller understanding of the nature of the present invention, reference should be had to the following detailed description taken in connection with the accompanying drawings in which.

Like reference numerals refer to like parts throughout the several views of the drawings.

DETAILED DESCRIPTION OF THE PREFERRED EMBODIMENT

Figure 1A:
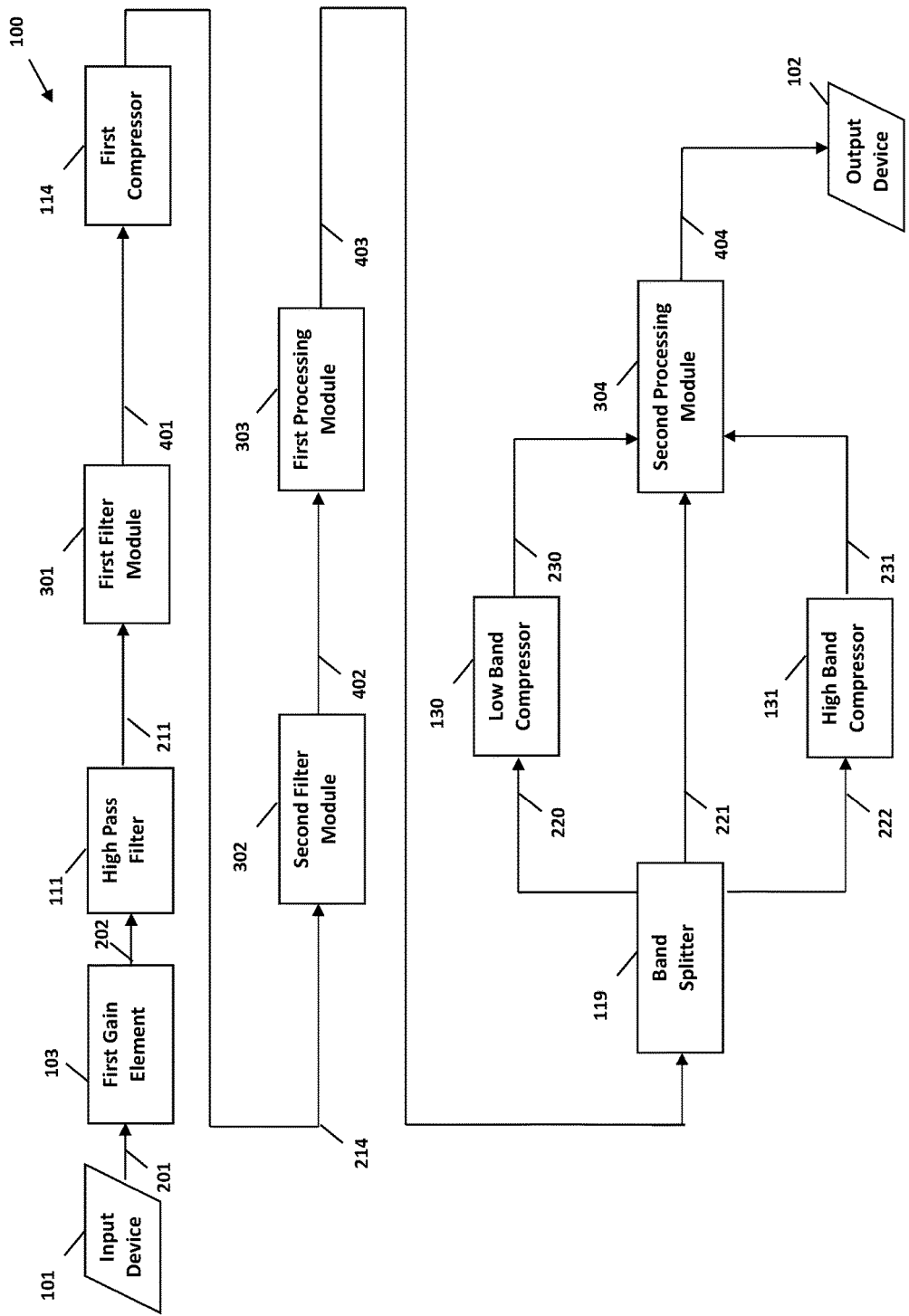
FIGS. 1A and 1B illustrate schematics of several embodiments of the present invention directed to systems for digitally processing an audio signal.
Figure 1B:
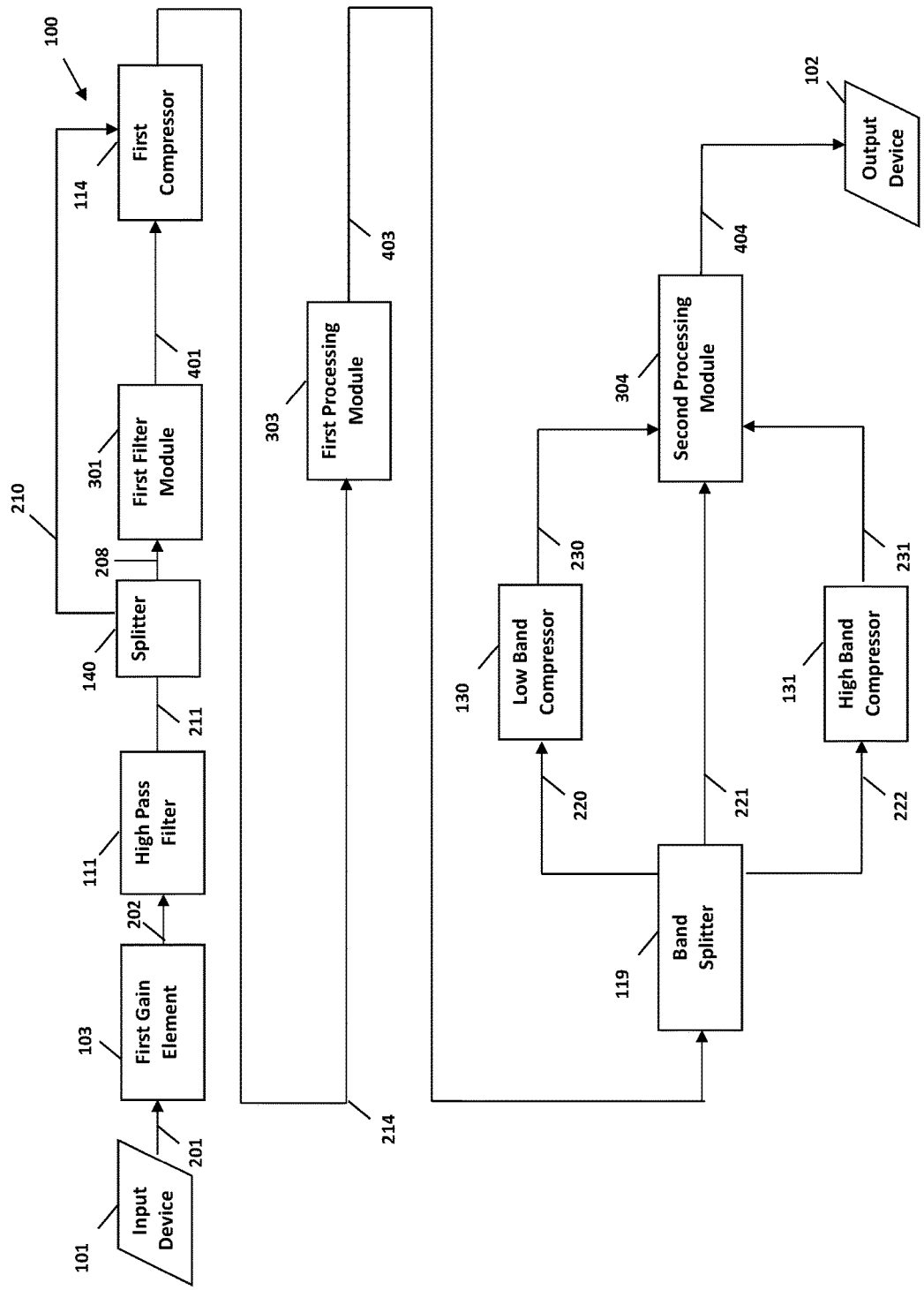

As illustrated by the accompanying drawings, the present invention is directed to systems and methods for digitally processing an audio signal. Specifically, some embodiments relate to digitally processing an audio signal in order to deliver studio-quality sound in a variety of different consumer electronic devices.

As schematically represented, FIGS. 1A, 1B, 1C, and 1D illustrate several preferred embodiments of a system 100 for digitally processing an audio signal, and FIGS. 2A, 2B, 2C, and 2D provide examples of several subcomponents and combinations of subcomponents of the modules of FIGS. 1A, 1B, 1C, and 1D. Accordingly, and in at least one preferred embodiment, the systems 100 and 300 generally comprise an input device 101, a high pass filter 111, a first filter module 301, a first compressor 114, a second filter module 302, a first processing module 303, a band splitter 119, a low band compressor 130, a high band compressor 131, a second processing module 304, and an output device 102. In at least another preferred embodiment, the systems 100 and 300 generally comprise an input device 101, a high pass filter 111, a splitter 140, a first filter module 301, a first compressor 114, a first processing module 303, a band splitter 119, a low band compressor 130, a high band compressor 131, a second processing module 304, and an output device 102. In at least another embodiment, the systems 100 and 300 may also comprise a first gain element 103.

The input device 101 is at least partially structured or configured to transmit an input audio signal 201 into the system 100 of the present invention, and in at least one embodiment into the high pass filter 111. In at least another embodiment, the input device 101 is at least partially structured or configured to transmit an input audio signal 201 into the system 100 of the present invention, into the first gain element 103. The input audio signal 201 may comprise the full audible range, or portions of the audible range. The input audio signal 201 may comprise a stereo audio signal. The input device 101 may comprise at least portions of an audio device capable of audio playback. The input device 101 for instance, may comprise a stereo system, a portable music player, a mobile device, a computer, a sound or audio card, or any other device or combination of electronic circuits suitable for audio playback.

The high pass filter 111 is configured to pass through high frequencies of an audio signal, such as the input signal 201, while attenuating lower frequencies, based on a predetermined frequency. In other words, the frequencies above the predetermined frequency may be transmitted to the first filter module 301 in accordance with the present invention. In at least one embodiment, ultra-low frequency content is removed from the input audio signal, where the predetermined frequency may be selected from a range between 300 Hz and 3 kHz. The predetermined frequency however, may vary depending on the source signal, and vary in other embodiments to comprise any frequency selected from the full audible range of frequencies between 20 Hz to 20 kHz. The predetermined frequency may be tunable by a user, or alternatively be statically set. The high pass filter 111 may further comprise any circuits or combinations thereof structured to pass through high frequencies above a predetermined frequency, and attenuate or filter out the lower frequencies.

Figure 2A:
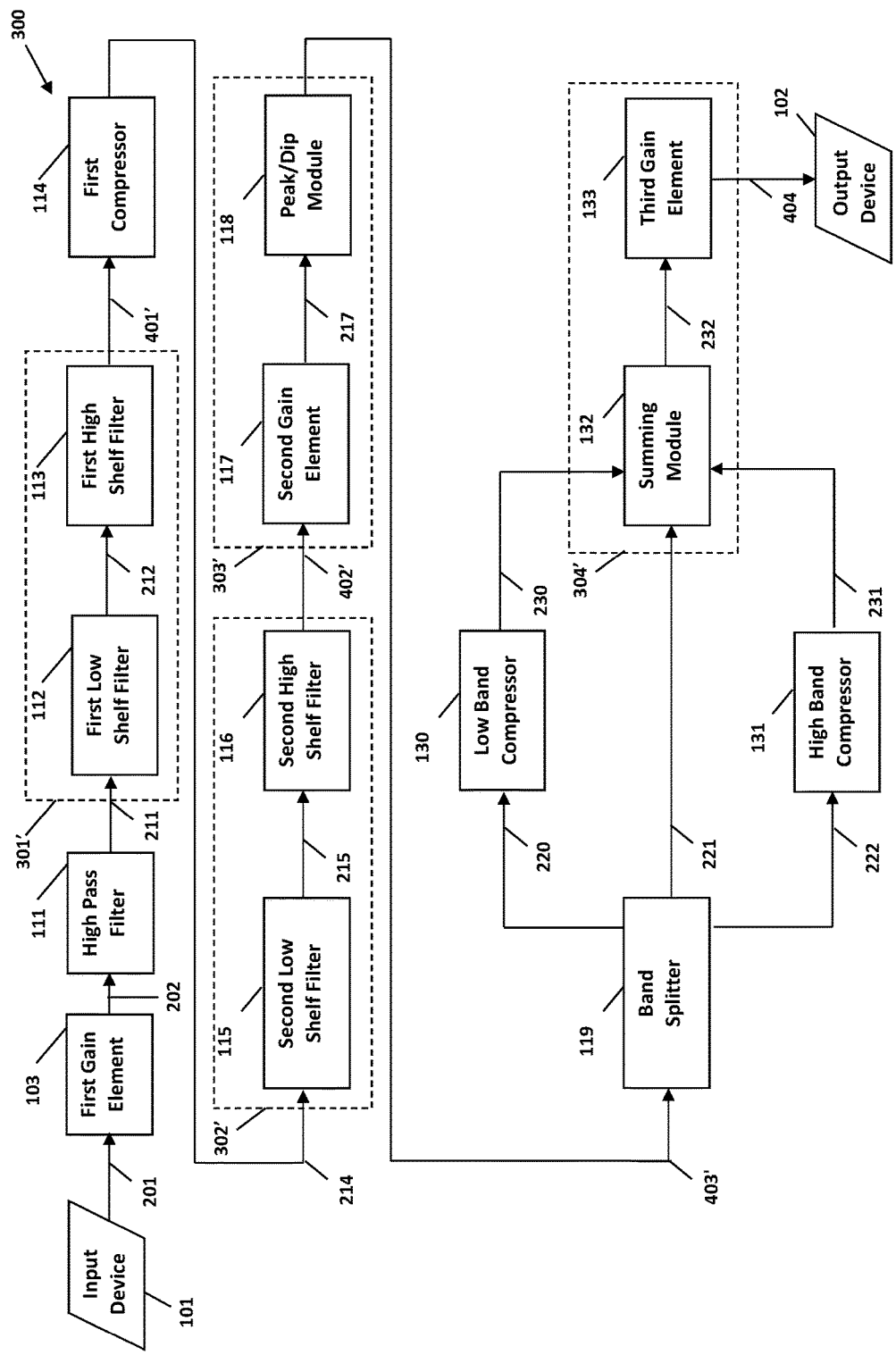
FIGS. 2A, 2B, 2C, and 2D illustrate schematics of several other embodiments of the present invention directed to systems for digitally processing an audio signal.
Figure 2B:
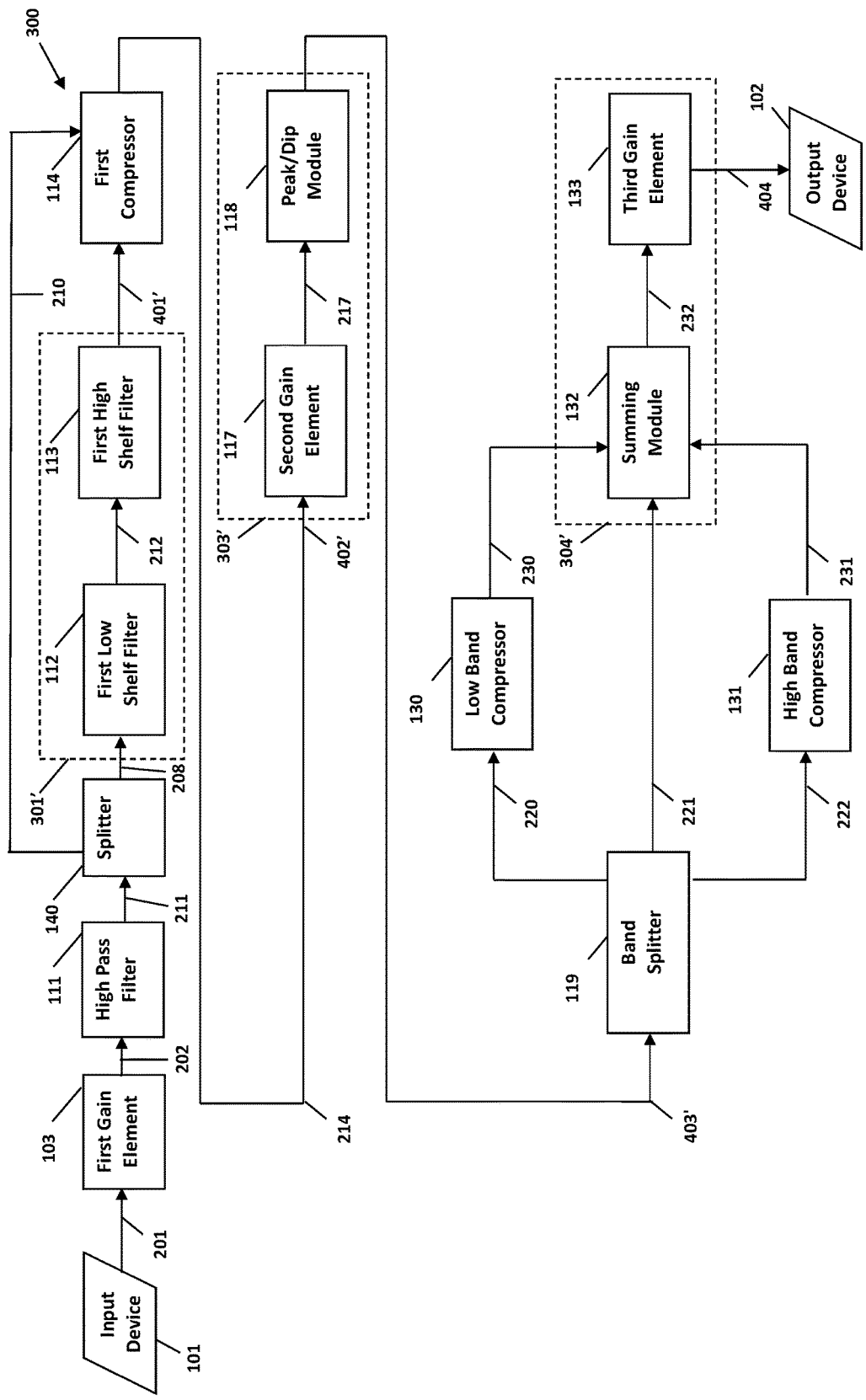
Figure 2C:
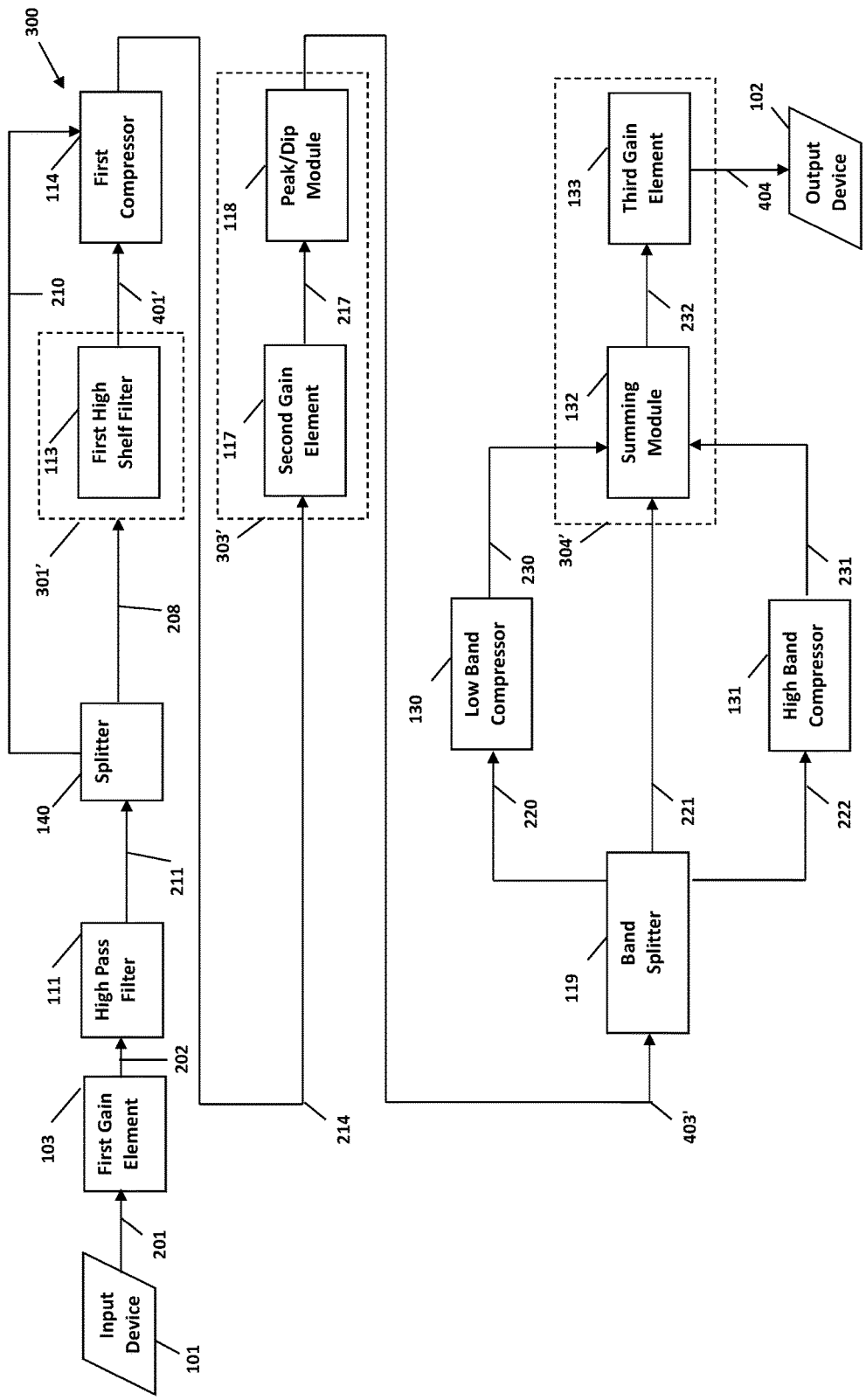
Figure 2D:
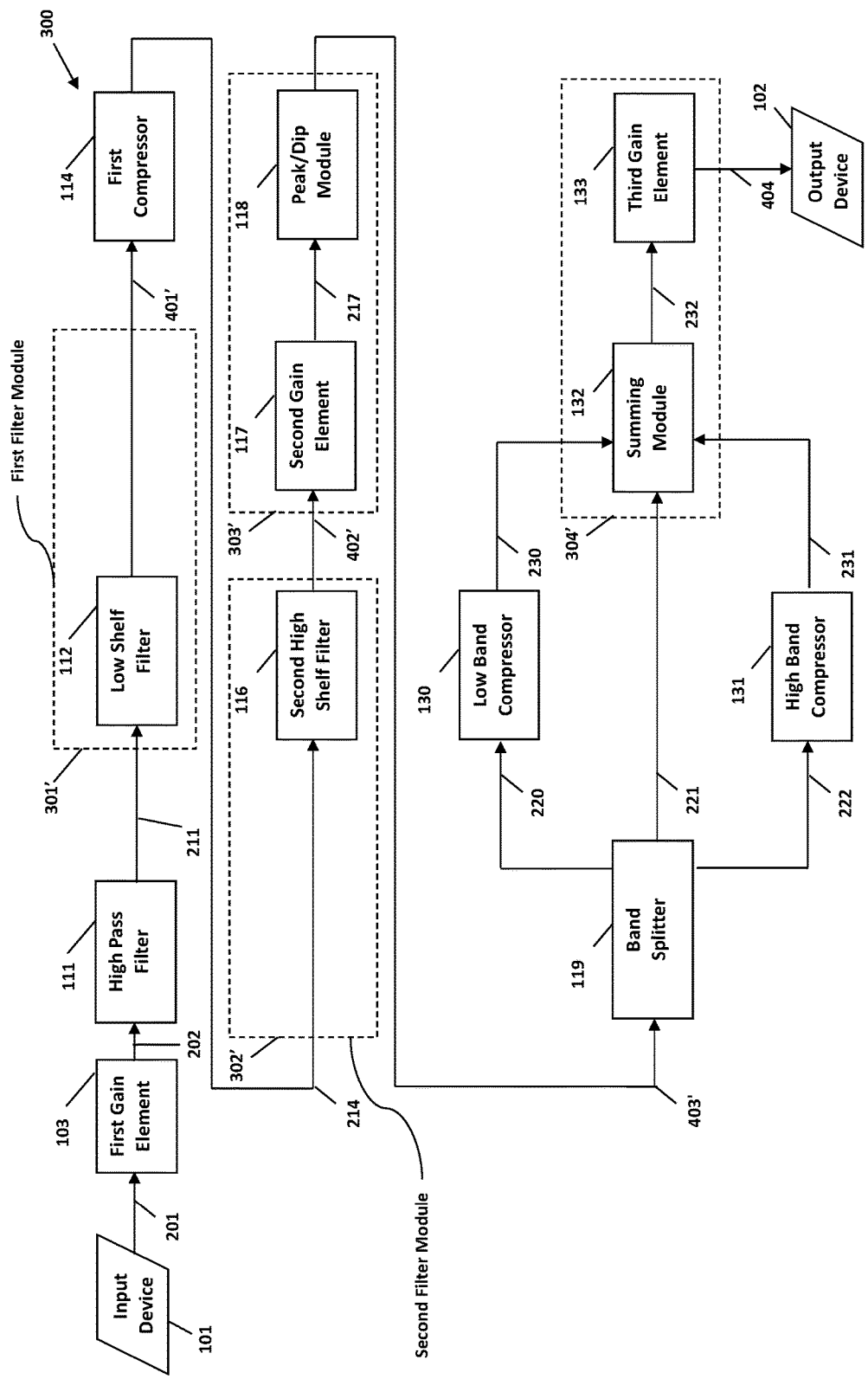
Figure 3A:
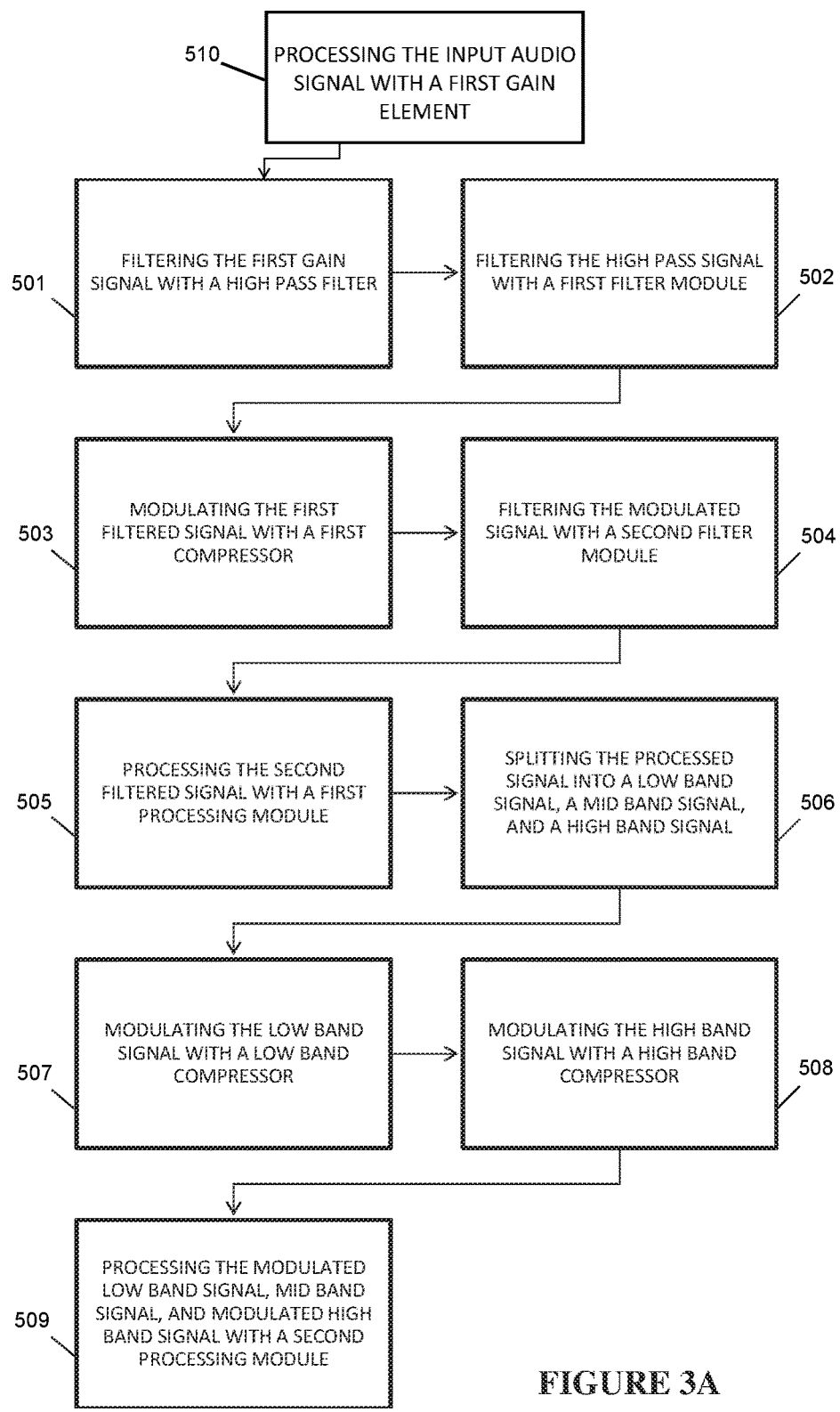
FIGS. 3A, 3B, 3C, and 3D illustrate block diagrams of several other embodiments of the present invention directed to methods for digitally processing an audio signal.
Figure 3B:
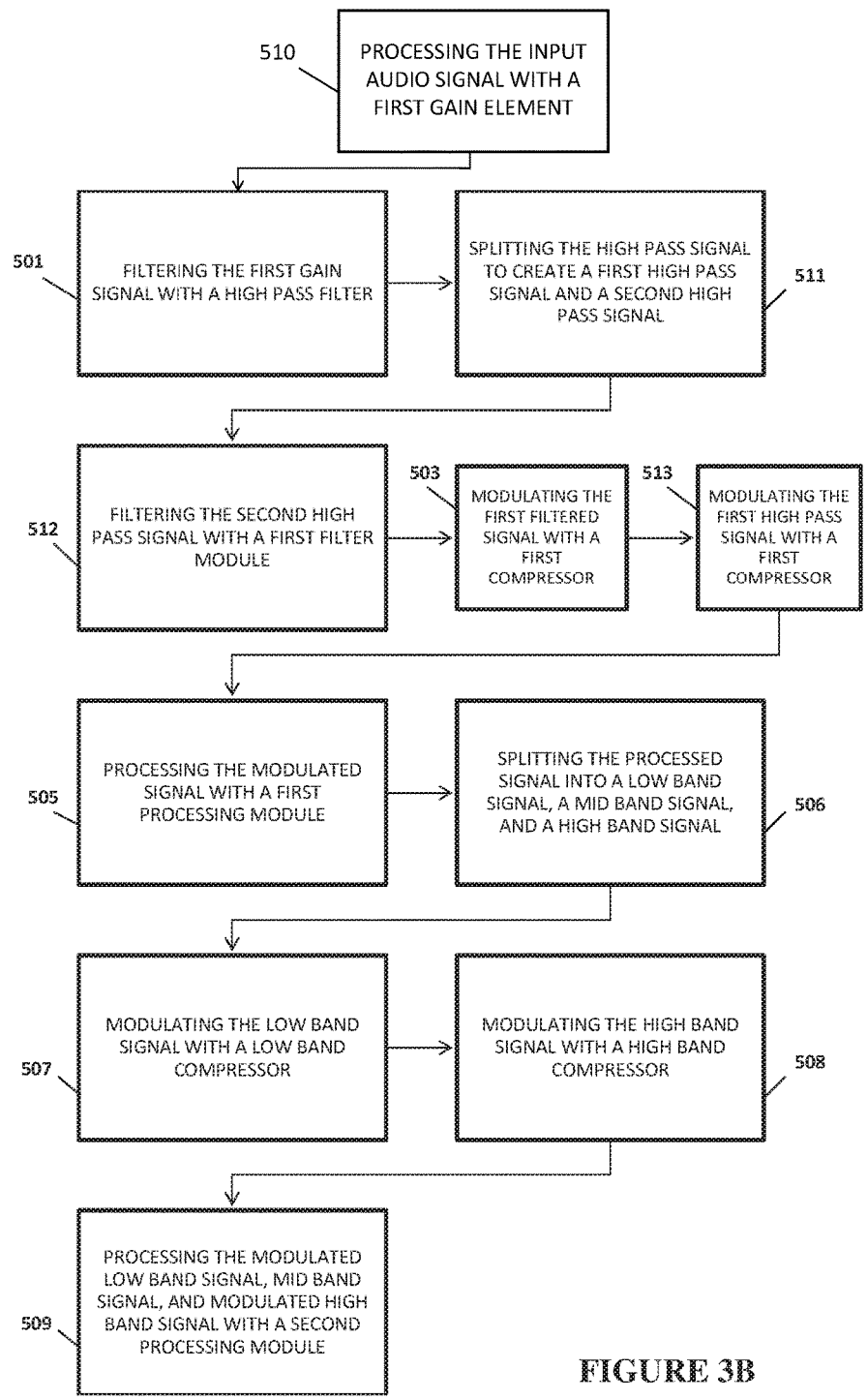
Figure 3C:
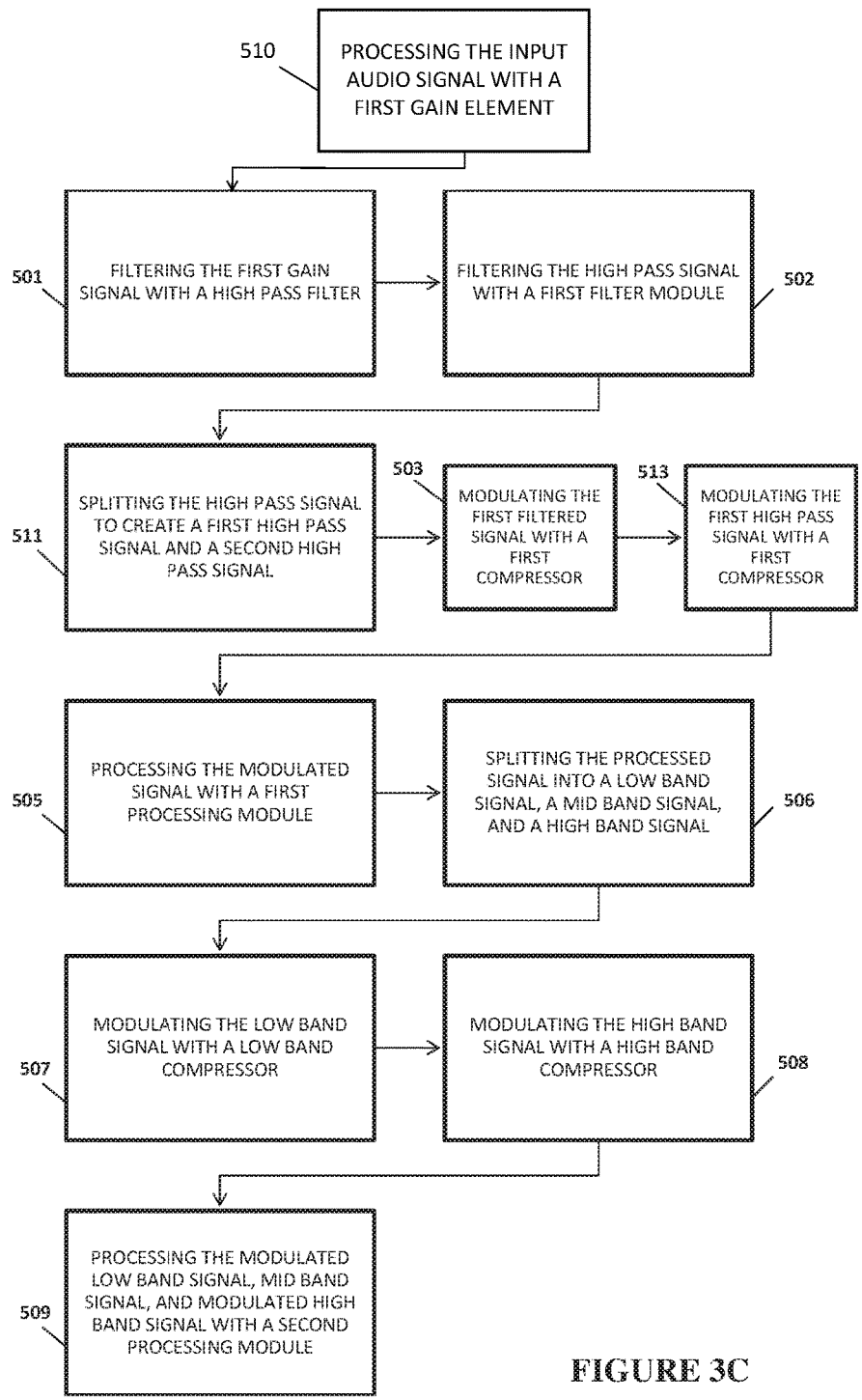
Figure 3D:
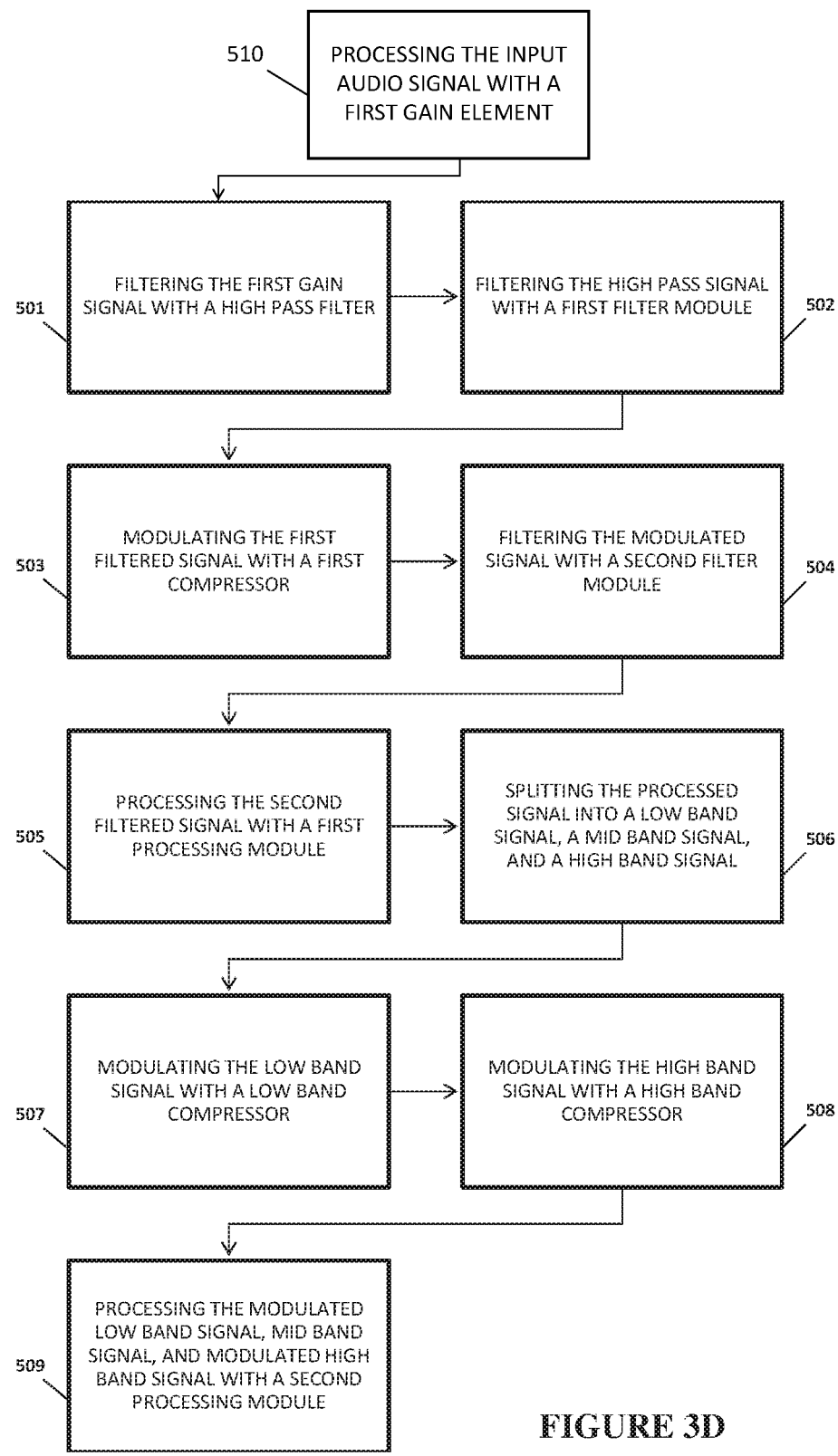
Figure 4A:
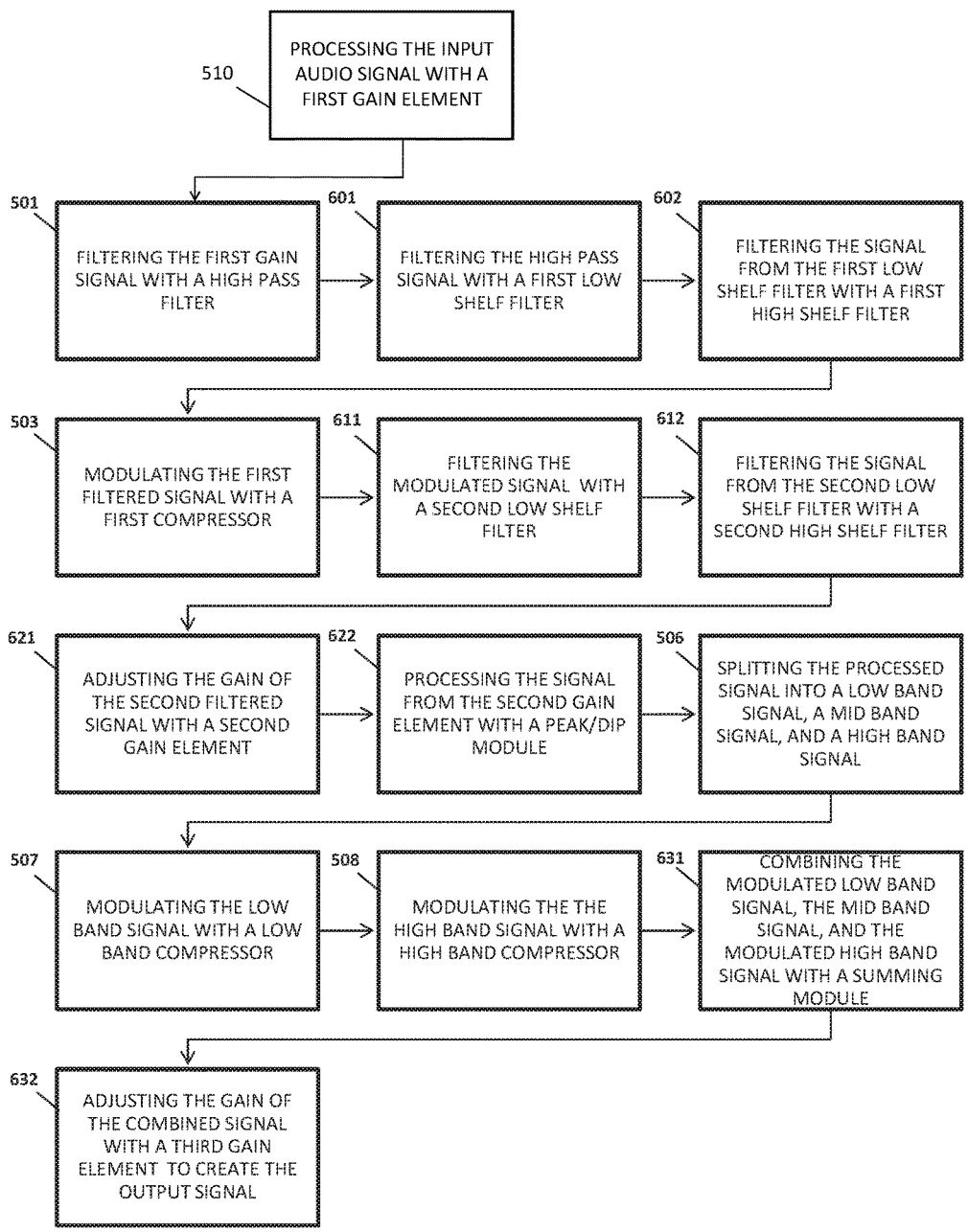
FIGS. 4A, 4B, 4C, and 4D illustrate block diagrams of several other embodiment of the present invention directed to methods for digitally processing an audio signal.
Figure 4B:
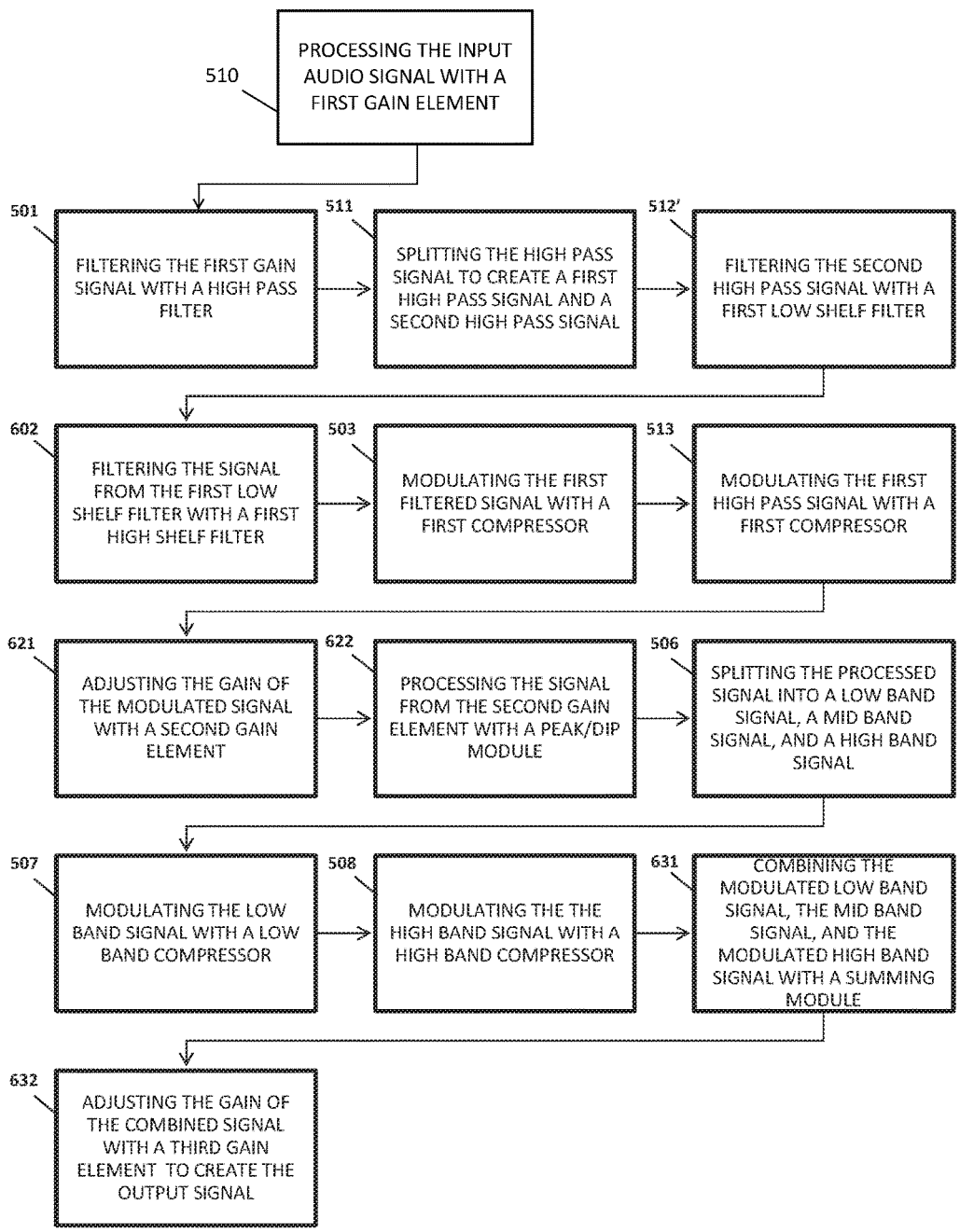
Figure 4C:
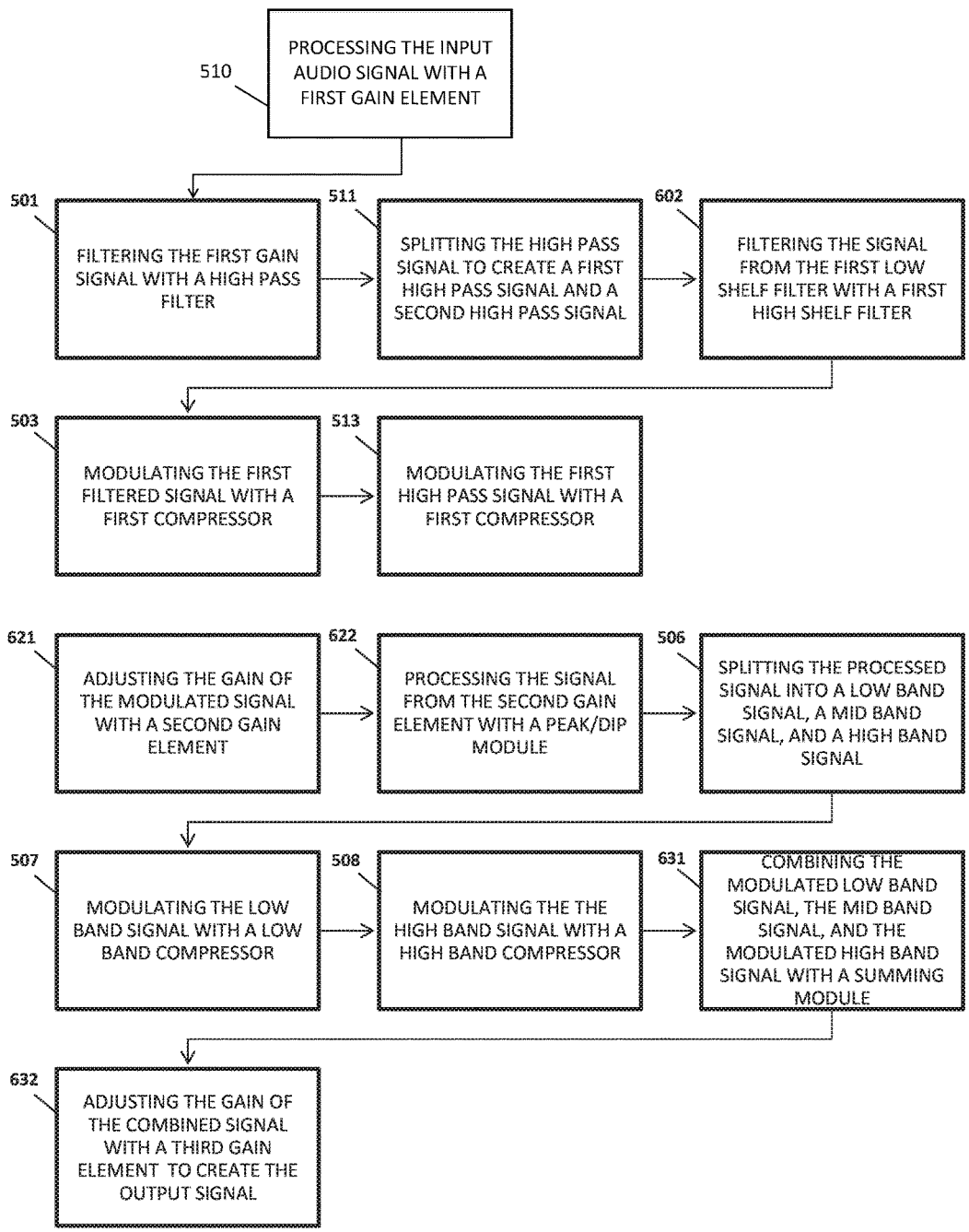
Figure 4D:
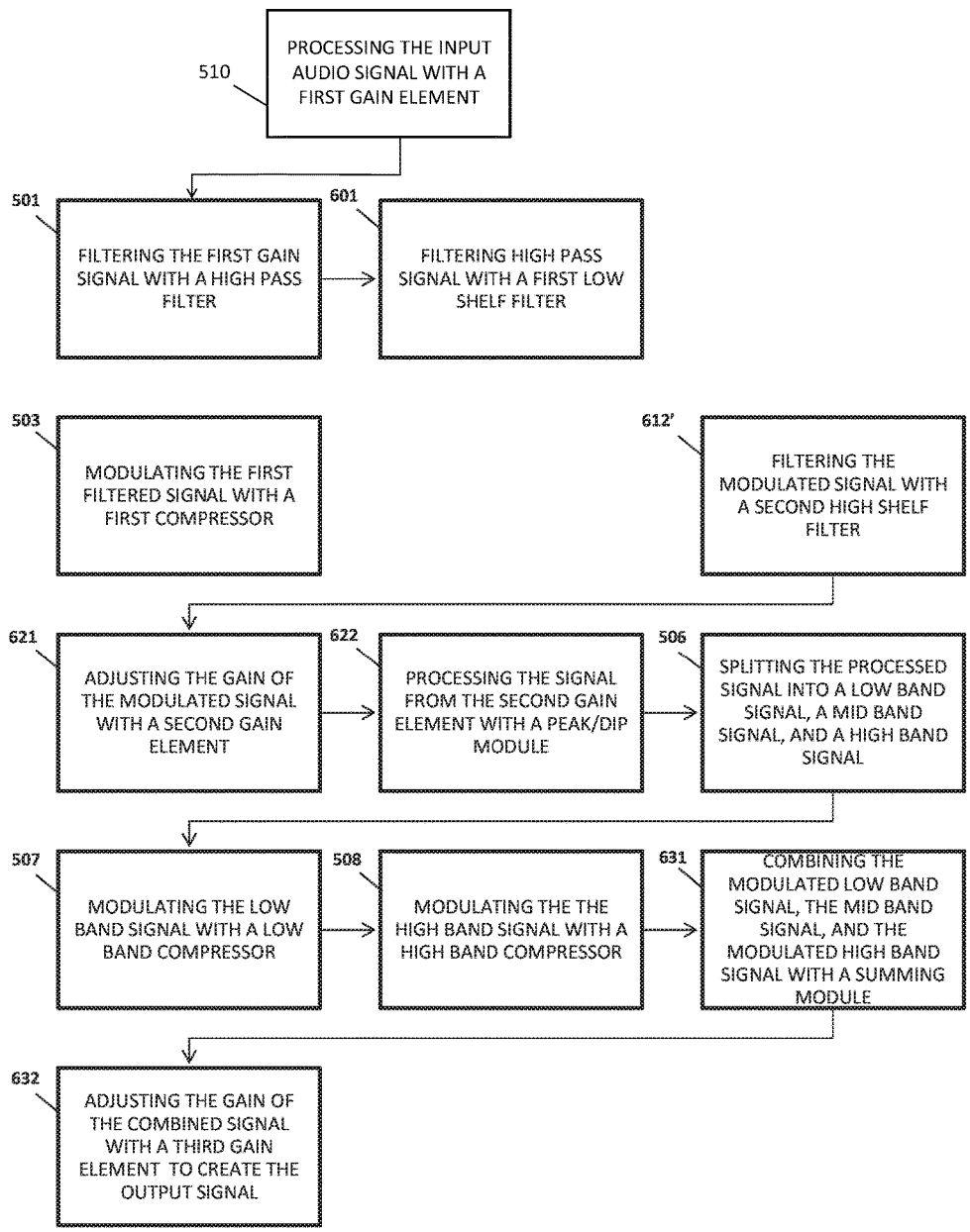

The first filter module 301 is configured to selectively boost or attenuate the gain of select frequency ranges within an audio signal, such as the high pass signal 211. For example, and in at least one embodiment, frequencies below a first frequency may be adjusted by ±X dB, while frequencies above a first frequency may be adjusted by ±Y dB. In other embodiments, a plurality of frequencies may be used to selectively adjust the gain of various frequency ranges within an audio signal. In at least one embodiment, the first filter module 301 may be implemented with a first low shelf filter 112 and a first high shelf filter 113, as illustrated in FIGS. 2A and 2B. In at least one other embodiment, the first filter module 301 may be implemented only with a first low shelf filter 112 as illustrated in FIG. 2D. In at least one other embodiment, the first filter module 301 may be implemented only with a first high shelf filter 113 as illustrated in FIG. 2C.

The first low shelf filter 112 and first high shelf filter 113 may both be second-order filters. In at least one embodiment, the first low shelf filter 112 attenuates content below a first frequency, and the first high shelf filter 113 boosts content above a first frequency. In other embodiments, the frequency used for the first low shelf filter 112 and first high shelf filter 113 may comprise two different frequencies. The frequencies may be static or adjustable. Similarly, the gain adjustment (boost or attenuation) may be static or adjustable.

In at least one embodiment, the splitter 140 is configured to split a signal, such as the high pass signal 211 from the high pass filter 111. In at least one embodiment, the high pass signal 211 from the high pass filter 111 is split into a first high pass signal 210 and a second high pass signal 208.

The first compressor 114 is configured to modulate a signal, such as the first filtered signal 401 or the first high pass signal 210. The first compressor 114 may comprise an automatic gain controller. The first compressor 114 may comprise standard dynamic range compression controls such as threshold, ratio, attack and release. Threshold allows the first compressor 114 to reduce the level of the filtered signal 211 if its amplitude exceeds a certain threshold. Ratio allows the first compressor 114 to reduce the gain as determined by a ratio. Attack and release determines how quickly the first compressor 114 acts. The attack phase is the period when the first compressor 114 is decreasing gain to reach the level that is determined by the threshold. The release phase is the period that the first compressor 114 is increasing gain to the level determined by the ratio. The first compressor 114 may also feature soft and hard knees to control the bend in the response curve of the output or modulated signal 212, and other dynamic range compression controls appropriate for the dynamic compression of an audio signal. The first compressor 114 may further comprise any device or combination of circuits that is structured and configured for dynamic range compression.

In at least one embodiment, the second filter module 302 is configured to selectively boost or attenuate the gain of select frequency ranges within an audio signal, such as the modulated signal 214. In at least one embodiment, the second filter module 302 is of the same configuration as the first filter module 301. Specifically, the second filter module 302 may comprise a second low shelf filter 115 and a second high shelf filter 116. In at least one embodiment, the second filter module 302 may comprise only a high shelf filer 116. The second filter module 302 may be configured in at least a partially inverse configuration to the first filter module 301. For instance, the second filter module may use the same frequency, for instance the first frequency, as the first filter module. Further, the second filter module may adjust the gain inversely to the gain or attenuation of the first filter module, of content above the first frequency. Similarly second filter module may also adjust the gain inversely to the gain or attenuation of the of the first filter module, of content below the first frequency. In other words, the purpose of the second filter module in one embodiment may be to "undo" the gain adjustment that was applied by the first filter module.

The first processing module 303 is configured to process a signal, such as the second filtered signal 402, or the first modulated signal 214. In at least one embodiment, the first processing module 303 may comprise a peak/dip module, such as 118 represented in FIGS. 2A, 2B, 2C, and 2D. In other embodiments, the first processing module 303 may comprise a second gain element 117. In various embodiments, the processing module 303 may comprise both a second gain element 117 and a peak/dip module 118 for the processing of a signal. The second gain element 117, in at least one embodiment, may be configured to adjust the level of a signal by a static amount. The second gain element 17 may comprise an amplifier or a multiplier circuit. In other embodiments, dynamic gain elements may be used. The peak/dip module 118 is configured to shape the desired output spectrum, such as to increase or decrease overshoots or undershoots in the signal. In some embodiments, the peak/dip module may further be configured to adjust the slope of a signal, for instance for a gradual slope that gives a smoother response, or alternatively provide for a steeper slope for more sudden sounds. In at least one embodiment, the peak/dip module 118 comprises a bank of ten cascaded peak/dipping filters. The bank of ten cascaded peaking/dipping filters may further be second-order filters. In at least one embodiment, the peak/dip module 118 may comprise an equalizer, such as parametric or graphic equalizers.

The band splitter 119 is configured to split a signal, such as the processed signal 403. In at least one embodiment, the signal is split into at least low band signal 220 and a high band signal 222, and preferably also a mid band signal 221. Each band may be the output of a fourth order section, which may be further realized as the cascade of second order biquad filters. In other embodiments, the band splitter may comprise any combination of circuits appropriate for splitting a signal into three frequency bands. At least the low, and high bands, and preferably a mid band may be predetermined ranges, or may be dynamically determined based on the frequency itself, i.e. a signal may be split into three even frequency bands, or by percentage. The different bands may further be defined or configured by a user and/or control mechanism.

A low band compressor 130 is configured to modulate the low band signal 220, and a high band compressor 131 is configured to modulate the high band signal 222. In at least one embodiment, each of the low band compressor 130 and high band compressor 131 may be the same as the first compressor 114. Accordingly, each of the low band compressor 130 and high band compressor 131 may each be configured to modulate a signal. Each of the compressors 130, 131 may comprise an automatic gain controller, or any combination of circuits appropriate for the dynamic range compression of an audio signal.

A second processing module 304 is configured to process at least one signal, such as the modulated low band signal 230 and the modulated high band signal 231, and preferably also a mid-band signal 221. Accordingly, the second processing module 304 may comprise a summing module 132 configured to combine a plurality of signals. The summing module 132 may comprise a mixer structured to combine two or more signals into a composite signal. The summing module 132 may comprise any circuits or combination thereof structured or configured to combine two or more signals. In at least one embodiment, the summing module 132 comprises individual gain controls for each of the incoming signals, such as the modulated low band signal 230 and the modulated high band signal 231, and preferably also a mid-band signal 221. In at least one embodiment, the second processing module 304 may further comprise a third gain element 133. The third gain element 133, in at least one embodiment, may be the same as the second gain element 117. The third gain element 133 may thus comprise an amplifier or multiplier circuit to adjust the signal, such as the combined signal, by a predetermined amount. The output device 102 may be structured to further process the output signal 404. The output device 102 may also be structured and/or configured for playback of the output signal 404.

As diagrammatically represented, FIGS. 3A, 3B, 3C, 3D, 4A, 4B, 4C, and 4D illustrate other embodiments directed to a method for digitally processing an audio signal, which may in at least one embodiment incorporate the components or combinations thereof from the systems 100 and/or 300 referenced above. Each step of the method in FIGS. 3A, 3B, 3C, 3D, 4A, 4B, 4C, and 4D as detailed below may also be in the form of a code segment directed to at least one embodiment of the present invention, which is stored on a non-transitory computer readable medium, for execution by a computer to process an input audio signal.

Accordingly, an input audio signal is filtered, as in 501, with a high pass filter to create a high pass signal. Alternatively, the input audio signal is first processed, as in 510, with a first gain element to create a first gain signal. The high pass filter is configured to pass through high frequencies of a signal, such as the input signal, or the first gain signal, while attenuating lower frequencies. In at least one embodiment, ultra-low frequency content is removed by the high-pass filter. In at least one embodiment, the high pass filter may comprise a fourth-order filter realized as the cascade of two second-order biquad sections. The reason for using a fourth order filter broken into two second order sections is that it allows the filter to retain numerical precision in the presence of finite word length effects, which can happen in both fixed and floating point implementations. An example implementation of such an embodiment may assume a form similar to the following:

Two memory locations are allocated, designated as d(k−1) and d(k−2), with each holding a quantity known as a state variable. For each input sample x(k), a quantity d(k) is calculated using the coefficients a1 and a2:

$$d(k)=x(k)-a1*d(k-1)-a2*d(k-2)$$

The output y(k) is then computed, based on coefficients b0, b1, and b2, according to:

$$y(k)=b0*d(k)+b1*d(k-1)+b2*d(k-2)$$

The above computation comprising five multiplies and four adds is appropriate for a single channel of second-order biquad section. Accordingly, because the fourth-order high pass filter is realized as a cascade of two second-order biquad sections, a single channel of fourth order input high pass filter would require ten multiples, four memory locations, and eight adds.

The high pass signal from the high pass filter is then filtered, as in 502, with a first filter module to create a first filtered signal. The first filter module is configured to selectively boost or attenuate the gain of select frequency ranges within an audio signal, such as the high pass signal. Accordingly, the first filter module may comprise a second order low shelf filter and a second order high shelf filter in at least one embodiment. In at least one embodiment, the first filter module boosts the content above a first frequency by a certain amount, and attenuates the content below a first frequency by a certain amount, before presenting the signal to a compressor or dynamic range controller. This allows the dynamic range controller to trigger and adjust higher frequency material, whereas it is relatively insensitive to lower frequency material.

In at least one embodiment, the high pass signal 211 from the high pass filter 111 is split, as in 511, with a splitter 140, into a first high pass signal 210, and a second high pass signal 208. In at least one embodiment, the second high pass signal is filtered with a first filter module. In at least one embodiment the first filtered signal 401 from the first filter module 301 is then modulated, as in 503, with a first compressor 114. In at least one embodiment, the first high pass signal 210 is modulated with a first compressor 114 as in 513. The first compressor may comprise an automatic or dynamic gain controller, or any circuits appropriate for the dynamic compression of an audio signal. Accordingly, the compressor may comprise standard dynamic range compression controls such as threshold, ratio, attack and release. An example implementation of the first compressor may assume a form similar to the following:

The compressor first computes an approximation of the signal level, where att represents attack time; rel represents release time; and invThr represents a precomputed threshold:
temp=abs(x(k))
if temp>level (k−1)
   level(k)=att*(level(k−1)−temp)+temp
else
   level=rel (level(k−1)−temp)+temp This level computation is done for each input sample. The ratio of the signal's level to invThr then determines the next step. If the ratio is less than one, the signal is passed through unaltered. If the ratio exceeds one, a table in the memory may provide a constant that is a function of both invThr and level:
if (level*thr<1)
   output(k)=x(k)
else
   index=floor(level*invThr)
if (index>99)
   index=99
gainReduction=table[index]
output(k)=gainReduction x(k)

In at least one embodiment, the modulated signal from the first compressor is then filtered, as in 504, with a second filter module to create a second filtered signal. The second filter module is configured to selectively boost or attenuate the gain of select frequency ranges within an audio signal, such as the modulated signal. Accordingly, the second filter module may comprise a second order low shelf filter and a second order high shelf filter in at least one embodiment. In at least one embodiment, the second filter module boosts the content above a second frequency by a certain amount, and attenuates the content below a second frequency by a certain amount. In at least one embodiment, the second filter module adjusts the content below the first specified frequency by a fixed amount, inverse to the amount that was removed by the first filter module. By way of example, if the first filter module boosted content above a first frequency by +X dB and attenuated content below a first frequency by −Y dB, the second filter module may then attenuate the content above the first frequency by −X dB, and boost the content below the first frequency by +Y dB. In other words, the purpose of the second filter module in one embodiment may be to "undo" the filtering that was applied by the first filter module.

In at least one embodiment, the second filtered signal from the second filter module is then processed, as in 505, with a first processing module to create a processed signal. In at least one embodiment, the modulated signal from the first compressor is then processed, as in 505', with a first processing module to create a processed signal. The processing module may comprise a second gain element configured to adjust the level of the signal. This adjustment, for instance, may be necessary because the peak-to-average ratio was modified by the first compressor. The processing module may comprise a peak/dip module. The peak/dip module may comprise ten cascaded second-order filters in at least one embodiment. The peak/dip module may be used to shape the desired output spectrum of the signal. In at least one embodiment, the first processing module comprises only the peak/dip module. In other embodiments, the first processing module comprises a gain element followed by a peak/dip module.

The processed signal from the first processing module is then split, as in 506, with a band splitter into at least a low band signal and a high band signal, and preferably also a mid band signal. The band splitter may comprise any circuit or combination of circuits appropriate for splitting a signal into a plurality of signals of different frequency ranges. In at least one embodiment, the band splitter comprises a fourth-order band-splitting bank. In this embodiment, each of the low band and high band, and preferably also a mid band, are yielded as the output of a fourth-order section, realized as the cascade of second-order biquad filters.

The low band signal is modulated, as in 507, with a low band compressor to create a modulated low band signal. The low band compressor may be configured and/or computationally identical to the first compressor in at least one embodiment. The high band signal is modulated, as in 508, with a high band compressor to create a modulated high band signal. The high band compressor may be configured and/or computationally identical to the first compressor in at least one embodiment.

At least the modulated low band signal and modulated high band signal, and preferably also a mid band signal, are then processed, as in 509, with a second processing module. The second processing module comprises at least a summing module. The summing module is configured to combine a plurality of signals into one composite signal. In at least one embodiment, the summing module may further comprise individual gain controls for each of the incoming signals, such as the modulated low band signal and the modulated high band signal, and preferably also a mid band signal. By way of example, an output of the summing module may be calculated by:

$$out=w0*low+w1*mid+w2*high$$

The coefficients w0, w1, and w2 represent different gain adjustments. The second processing module may further comprise a second gain element. The second gain element may be the same as the first gain element in at least one embodiment. The second gain element may provide a final gain adjustment. Finally, the second processed signal is transmitted as the output signal.

As diagrammatically represented, FIG. 4 illustrates another embodiment directed to a method for digitally processing an audio signal, which may in at least one embodiment incorporate the components or combinations thereof from the systems 100 and/or 300 referenced above. Because the individual components of FIG. 4 have been discussed in detail above, they will not be discussed here. Further, each step of the method in FIG. 4 as detailed below may also be in the form of a code segment directed to at least one embodiment of the present invention, which is stored on a non-transitory computer readable medium, for execution by a computer to process an input audio signal.

Accordingly, an input audio signal such as the first gain signal is first filtered, as in 501, with a high pass filter. The high pass signal from the high pass filter is then filtered, as in 601, with a first low shelf filter. The signal from the first low shelf filter is then filtered with a first high shelf filter, as in 602. The first filtered signal from the first low shelf filter is then modulated with a first compressor, as in 503. In at least one embodiment, the modulated signal from the first compressor is filtered with a second low shelf filter as in 611. The signal from the low shelf filter is then filtered with a second high shelf filter, as in 612. In at least one embodiment, the modulated signal from the first compressor is filtered with a second high shelf filter as in 612'. In at least one embodiment, the second filtered signal from the second low shelf filter, is then gain-adjusted with a second gain element, as in 621. In at least one embodiment, the second filtered signal from the second high shelf filter, is then gain-adjusted with a second gain element, as in 621. The signal from the second gain element is further processed with a peak/dip module, as in 622. The processed signal from the peak/dip module is then split into at least a low band signal and a high band signal, but preferably also a mid band signal, as in 506. The low band signal is modulated with a low band compressor, as in 507. The high band signal is modulated with a high band compressor, as in 508. At least the modulated low band signal and modulated high band signal, and also preferably a mid band signal, are then combined with a summing module, as in 631. The combined signal is then gain adjusted with a third gain element in order to create the output signal, as in 632.

Any of the above methods may be completed in sequential order in at least one embodiment, though they may be completed in any other order. In at least one embodiment, the above methods may be exclusively performed, but in other embodiments, one or more steps of the methods as described may be skipped Since many modifications, variations and changes in detail can be made to the described preferred embodiment of the invention, it is intended that all matters in the foregoing description and shown in the accompanying drawings be interpreted as illustrative and not in a limiting sense. Thus, the scope of the invention should be determined by the appended claims and their legal equivalents. Furthermore, in that various embodiments may include one, two or three of a specific element, such as a gain controller, reference to them as first, second and third is included for facilitated reference when more than one is included, but should not be viewed as limiting to require one, two or three in any or all instances. For example, reference to a second gain element does not require that all embodiments include a first gain element.

Now that the invention has been described,

What is claimed is:

1. A system for digital signal processing of an input audio signal comprising:
    a high pass filter configured to filter an audio signal to create a high pass signal,
    a first filter module configured to filter the high pass signal to create a first filtered signal,
    a first compressor configured to modulate the first filtered signal to create a modulated signal,
    a second filter module configured to filter the modulated signal to create a second filtered signal,
    a first processing module configured to process the second filtered signal to create a processed signal,
    a band splitter configured to split the processed signal into at least a first low band signal and a second high band signal,
    at least a first modulator structured to modulate said first band signal and a second modulator structured to modulate said second band signal to create a first and a second modulated band signal, and a second processing module configured to process at least said first and said second modulated band signals to create an output signal.

2. A system as recited in claim 1 wherein the first filter module comprises:
   a first low shelf filter configured to filter the high pass signal to create a first low shelf signal,
   a first high shelf filter configured to filter the first low shelf signal to create the first filtered signal.

3. A system as recited in claim 1 wherein said second filter module comprises:
   a second low shelf filter configured to filter the modulated signal to create a second low shelf signal, and
   a second high shelf filter configured to filter second low shelf signal to create the second filtered signal.

4. A system as recited in claim 1 wherein said first filter module comprises a low shelf filter and said second filter module comprises a high shelf filter.

5. A system as recited in claim 1 further comprising a first gain element configured to adjust a gain of the input audio signal prior to said high pass filter.

6. A system as recited in claim 1 wherein said first processing module comprises a gain element configured to adjust the gain of the second filtered signal to create a gain signal; and a peak/dip module configured to process the gain signal to create the processed signal.

7. A system as recited in claim 1 wherein said second processing module comprises: a summing module configured to combine at least the first and second modulated band signals to create a combined signal, and a gain element configured to adjust the gain of the combined signal to create the output signal.

8. A system as recited in claim 1 wherein said band splitter splits the processed signal into at least a low band signal and a high band signal, and said first modulator comprises a band compressor.

9. A system as recited in claim 8 wherein said first modulator comprises a low band modulator and said second modulator comprises a high band modulator.

* * * * *